US010225919B2

(12) United States Patent
Hoffman et al.

(10) Patent No.: US 10,225,919 B2
(45) Date of Patent: Mar. 5, 2019

(54) PROJECTED PLASMA SOURCE

(75) Inventors: Daniel J. Hoffman, Fort Collins, CO (US); Daniel Carter, Fort Collins, CO (US); Karen Peterson, Loveland, CO (US); Randy Grilley, Pierce, CO (US)

(73) Assignee: AES Global Holdings, PTE. LTD, Singapore (SG)

( * ) Notice: Subject to any disclaimer, the term of this patent is extended or adjusted under 35 U.S.C. 154(b) by 900 days.

(21) Appl. No.: 13/173,752

(22) Filed: Jun. 30, 2011

(65) Prior Publication Data

US 2013/0001196 A1    Jan. 3, 2013

(51) Int. Cl.
    *C23C 16/50*    (2006.01)
    *C23C 16/517*   (2006.01)
    (Continued)

(52) U.S. Cl.
    CPC ............. *H05H 1/46* (2013.01); *C23C 16/50* (2013.01); *C23C 16/517* (2013.01);
    (Continued)

(58) Field of Classification Search
    CPC ............. H05H 2001/2443–2001/2468; H05H 2001/245; H05H 2001/4645–2001/4675; H05H 1/04; H05H 1/24; H05H 1/2406; H05H 5/03; H05H 5/63; H05H 1/46; H05H 2001/469–2001/4697; H05H 2007/122; H05H 3/02; H05H 1/26–1/44; H05H 1/024; H05H 1/2046; H05H 41/26–41/44;
    (Continued)

(56) References Cited

U.S. PATENT DOCUMENTS 3,588,594 A * 6/1971 Matsuno et al. ......... H05H 1/46
                                                219/121.48
4,123,316 A * 10/1978 Tsuchimoto ............. 156/345.35
    (Continued)

FOREIGN PATENT DOCUMENTS

| CN | 1474882 A | 2/2004 |
| CN | 1635177 A | 7/2005 |

(Continued)

OTHER PUBLICATIONS

Drawings from USSN: 12819449 (published as US 20100320379 A1 {Morrisroe'379} & issued as U.S. Pat. No. 8,289,512 B2 {Morrisroe'512}) that is a continuation of U.S. Appl. No. 11/156,274 (published as US 20100320379 A1 {Morrisroe'379} & issued as U.S. Pat. No. 8,289,512 B2 {Morrisroe'512}). 2005. pp. 1-315. (Year: 2005).*

(Continued)

*Primary Examiner* — Jeffrie R Lund
*Assistant Examiner* — Stanislav Antolin
(74) *Attorney, Agent, or Firm* — Neugeboren O'Dowd PC

(57) ABSTRACT

This disclosure describes systems, methods, and apparatuses for generating an ionizing electromagnetic field via a remote plasma source such that the field controllably extends through a field projection portion where the field attenuates, to a plasma processing portion where the field is attenuated but still strong enough to sustain a plasma. The plasma has a low voltage and RF energy and can be used for a variety of semiconductor and thin film processing operations including chamber cleaning via radical generation, etching, and deposition.

21 Claims, 12 Drawing Sheets

(51) Int. Cl.
*H01J 37/32* (2006.01)
*H05H 1/46* (2006.01)

(52) U.S. Cl.
CPC .... *H01J 37/3266* (2013.01); *H01J 37/32357* (2013.01); *H01J 37/32422* (2013.01); *H01J 37/32697* (2013.01); *H01J 37/32862* (2013.01)

(58) Field of Classification Search
CPC .... H05H 41/46; C23C 14/345; C23C 14/354; C23C 16/452; C23C 16/45574; C23C 16/50; C23C 16/503; C23C 16/505; C23C 16/507; C23C 16/509; C23C 16/517; H01J 37/32009–37/32422; H01J 37/32532–37/32614; H01J 37/3266; H01J 37/32697; H01J 37/32862; H01J 37/32889; H01J 2237/06–2237/0835; H01J 2237/06325–2237/06366; H01J 37/32082; H01J 37/321; F16K 13/10; F16K 31/06; G02B 26/02; G03B 9/02; G05D 7/005; G05D 7/0186; H01L 41/12; Y10T 137/0318; Y10T 29/49
USPC .......... 118/723 ER, 723 IR, 723 MR, 723 R; 156/345.33, 345.34, 345.35, 345.36
See application file for complete search history.

(56) References Cited

U.S. PATENT DOCUMENTS

| | | | |
|---|---|---|---|
| 4,778,561 A * | 10/1988 | Ghanbari | 118/728 |
| 4,870,030 A * | 9/1989 | Markunas et al. | 427/574 |
| 4,918,031 A * | 4/1990 | Flamm et al. | 438/695 |
| 5,091,049 A * | 2/1992 | Campbell et al. | 216/37 |
| 5,107,170 A * | 4/1992 | Ishikawa et al. | 313/362.1 |
| 5,114,529 A * | 5/1992 | Masuyama et al. | 438/725 |
| 5,156,703 A * | 10/1992 | Oechsner | 118/723 ER |
| 5,234,529 A * | 8/1993 | Johnson | 118/723 I |
| 5,242,561 A * | 9/1993 | Sato | C23C 14/32 134/1.1 |
| 5,336,366 A * | 8/1994 | Cain et al. | 438/730 |
| RE34,806 E * | 12/1994 | Cann | 118/723 DC |
| 5,487,785 A | 1/1996 | Horiike et al. | |
| 5,506,475 A * | 4/1996 | Alton | H01J 27/18 315/111.21 |
| 5,534,751 A * | 7/1996 | Lenz | H01J 37/32623 156/345.43 |
| 5,815,047 A * | 9/1998 | Sorensen | H03H 7/40 315/111.21 |
| 5,859,428 A * | 1/1999 | Fruchtman | 250/251 |
| 5,957,969 A * | 9/1999 | Warner | A61B 18/1206 606/34 |
| 5,989,779 A * | 11/1999 | Hatakeyama et al. | 430/296 |
| 6,017,221 A * | 1/2000 | Flamm | 438/14 |
| 6,019,060 A * | 2/2000 | Lenz | H01J 37/32623 118/723 R |
| 6,073,578 A * | 6/2000 | Shim et al. | 118/723 I |
| 6,140,773 A * | 10/2000 | Anders et al. | 315/111.21 |
| 6,156,667 A | 12/2000 | Jewett | |
| 6,239,553 B1 * | 5/2001 | Barnes | H01J 37/321 118/723 AN |
| 6,291,938 B1 * | 9/2001 | Jewett | H01J 37/32009 156/345.48 |
| 6,326,584 B1 | 12/2001 | Jewett et al. | |
| 6,392,210 B1 | 5/2002 | Jewett et al. | |
| 6,396,214 B1 * | 5/2002 | Grosse | H01J 37/32357 315/111.21 |
| 6,707,051 B2 | 3/2004 | Shun'ko | |
| 6,724,148 B1 | 4/2004 | Gonzalez et al. | |
| 6,819,096 B2 | 11/2004 | Gonzalez et al. | |
| 6,822,396 B2 | 11/2004 | Gonzalez et al. | |
| 6,887,339 B1 * | 5/2005 | Goodman | H01J 37/32082 118/723 E |
| 6,927,358 B2 | 8/2005 | Gonzalez et al. | |
| 6,946,063 B1 | 9/2005 | Gonzalez et al. | |
| 7,005,845 B1 | 2/2006 | Gonzalez et al. | |
| 7,042,311 B1 * | 5/2006 | Hilliker | H01J 37/32082 333/133 |
| 7,245,084 B1 | 7/2007 | Gonzalez et al. | |
| 7,411,352 B2 * | 8/2008 | Madocks | 315/111.21 |
| 7,465,478 B2 | 12/2008 | Collins et al. | |
| 7,468,494 B2 | 12/2008 | Gonzalez et al. | |
| 7,482,757 B2 * | 1/2009 | Quon et al. | 315/111.21 |
| 7,679,025 B1 * | 3/2010 | Krishnan | G21G 4/02 219/121.48 |
| 7,742,167 B2 * | 6/2010 | Morrisroe | F23C 99/003 219/121.48 |
| 8,067,737 B1 * | 11/2011 | Sayyah | 250/336.1 |
| 8,289,512 B2 * | 10/2012 | Morrisroe | C23C 16/402 423/335 |
| 8,294,369 B1 * | 10/2012 | Laroussi | 315/111.21 |
| 8,622,735 B2 * | 1/2014 | Morrisroe | H01L 21/02063 438/707 |
| 2001/0014540 A1 | 8/2001 | Shan et al. | |
| 2002/0073925 A1 * | 6/2002 | Noble et al. | 118/723 ME |
| 2002/0161362 A1 * | 10/2002 | Penny | A61B 18/042 606/41 |
| 2003/0029567 A1 * | 2/2003 | Dhindsa | H01J 37/32082 156/345.47 |
| 2003/0047449 A1 * | 3/2003 | Hanawa | H01J 37/32082 204/298.06 |
| 2003/0080097 A1 * | 5/2003 | Boulos | H05H 1/30 219/121.49 |
| 2003/0165617 A1 * | 9/2003 | Kagadei | H05H 3/02 427/248.1 |
| 2003/0226641 A1 * | 12/2003 | Collins | H01J 37/32082 156/345.49 |
| 2004/0007326 A1 * | 1/2004 | Roche | H01J 37/32935 156/345.24 |
| 2004/0026231 A1 * | 2/2004 | Pribyl | H01J 37/32082 204/164 |
| 2004/0050685 A1 * | 3/2004 | Yara | C23C 16/4409 204/164 |
| 2004/0094402 A1 | 5/2004 | Gopalraja et al. | |
| 2004/0100341 A1 * | 5/2004 | Luetzelschwab | H03F 1/56 333/32 |
| 2004/0115936 A1 * | 6/2004 | DePetrillo | C01B 7/01 438/689 |
| 2004/0131513 A1 * | 7/2004 | Lazarovich | B01D 53/326 422/186.04 |
| 2004/0134614 A1 * | 7/2004 | Jevtic | H01J 37/32082 156/345.43 |
| 2004/0149219 A1 * | 8/2004 | Okumura | H01J 37/321 118/723 I |
| 2004/0150386 A1 * | 8/2004 | Gonzalez | H01J 37/321 324/117 R |
| 2004/0178966 A1 * | 9/2004 | Rawnick | H01Q 1/288 343/912 |
| 2004/0227588 A1 * | 11/2004 | Brown | H01P 1/184 333/156 |
| 2004/0256365 A1 * | 12/2004 | DePetrillo | H05H 1/30 219/121.49 |
| 2004/0263412 A1 * | 12/2004 | Pribyl | H01J 37/32082 343/866 |
| 2005/0012441 A1 * | 1/2005 | Schulteiss et al. | 313/141 |
| 2005/0024167 A1 * | 2/2005 | Rawnick | H01P 3/122 333/248 |
| 2005/0093459 A1 * | 5/2005 | Kishinevsky | H01J 37/32082 315/111.21 |
| 2005/0099133 A1 * | 5/2005 | Quon et al. | 315/111.01 |
| 2005/0264218 A1 * | 12/2005 | Dhindsa | H01J 37/32082 315/111.21 |
| 2005/0276928 A1 * | 12/2005 | Okumura et al. | 427/446 |
| 2006/0051505 A1 * | 3/2006 | Kortshagen | B82Y 30/00 427/212 |
| 2006/0113182 A1 * | 6/2006 | Park | H05H 1/54 204/192.12 |
| 2006/0118518 A1 * | 6/2006 | Rusu | H01J 37/32082 216/67 |
| 2006/0130971 A1 | 6/2006 | Chang et al. | |

(56) References Cited

U.S. PATENT DOCUMENTS

| | | | |
|---|---|---|---|
| 2006/0162657 A1* | 7/2006 | Cirigliano | C23F 4/00 118/715 |
| 2006/0177599 A1* | 8/2006 | Madocks | 427/569 |
| 2006/0285108 A1* | 12/2006 | Morrisroe | F23C 99/003 356/316 |
| 2006/0286492 A1* | 12/2006 | Morrisroe | F23C 99/001 431/2 |
| 2007/0039165 A1* | 2/2007 | Xia | 29/599 |
| 2007/0072432 A1* | 3/2007 | Yoon | H01L 21/02063 438/707 |
| 2007/0170155 A1* | 7/2007 | Fink | H01J 37/32009 219/121.43 |
| 2007/0181421 A1* | 8/2007 | Wei et al. | 204/298.02 |
| 2007/0227666 A1* | 10/2007 | Matsumoto et al. | 156/345.47 |
| 2007/0235426 A1* | 10/2007 | Matsumoto | H01J 37/32082 219/121.43 |
| 2008/0037197 A1* | 2/2008 | Casset | H01G 5/0132 361/287 |
| 2008/0127893 A1* | 6/2008 | Tomasel et al. | 118/723 E |
| 2008/0152938 A1* | 6/2008 | Kelman | B22F 1/0022 428/546 |
| 2008/0220175 A1* | 9/2008 | Mangolini | B01J 19/088 427/430.1 |
| 2008/0236749 A1* | 10/2008 | Koshimizu | H01J 37/32091 156/345.33 |
| 2008/0238569 A1* | 10/2008 | Matsuo | H03H 7/40 333/32 |
| 2008/0286489 A1* | 11/2008 | Wang | H01J 37/32458 427/569 |
| 2008/0308535 A1* | 12/2008 | Rego | H05H 1/2406 219/121.52 |
| 2009/0011150 A1 | 1/2009 | Jeon et al. | |
| 2009/0026421 A1* | 1/2009 | Li | B22F 1/0018 252/500 |
| 2009/0065485 A1* | 3/2009 | O'Neill et al. | 219/121.52 |
| 2009/0133622 A1* | 5/2009 | Huang | B05D 1/62 118/663 |
| 2009/0142514 A1* | 6/2009 | O'Neill et al. | 427/595 |
| 2009/0188626 A1* | 7/2009 | Lu | H05H 1/24 156/345.35 |
| 2009/0242135 A1* | 10/2009 | Koshimizu | H01J 37/32091 156/345.48 |
| 2010/0028238 A1* | 2/2010 | Maschwitz | C23C 16/402 423/335 |
| 2010/0101603 A1 | 4/2010 | Chebi et al. | |
| 2010/0108491 A1* | 5/2010 | Yoon | H01L 21/02063 204/164 |
| 2010/0125267 A1* | 5/2010 | Lee | A61B 18/042 606/27 |
| 2010/0276273 A1* | 11/2010 | Heckman | C23C 14/54 204/192.11 |
| 2010/0310434 A1* | 12/2010 | Buchanan et al. | 422/186.04 |
| 2010/0320379 A1* | 12/2010 | Morrisroe | F23C 99/003 250/288 |
| 2011/0023780 A1* | 2/2011 | Ramaswamy | H01P 7/04 118/708 |
| 2011/0089017 A1* | 4/2011 | Hur | H01J 37/32541 204/157.15 |
| 2011/0095689 A1 | 4/2011 | Gilbert | |
| 2011/0101862 A1* | 5/2011 | Koo | H01J 37/32366 315/111.21 |
| 2011/0140607 A1* | 6/2011 | Moore | A61B 18/042 315/111.21 |
| 2011/0226617 A1* | 9/2011 | Hofmann | C23C 14/06 204/298.04 |
| 2011/0298376 A1* | 12/2011 | Kanegae et al. | 315/111.51 |
| 2012/0021132 A1* | 1/2012 | Shimizu | C23C 14/083 427/453 |
| 2012/0062153 A1* | 3/2012 | Popovic | H05H 7/18 315/501 |
| 2012/0112815 A1* | 5/2012 | Mason | C23C 14/32 134/1.1 |
| 2012/0187844 A1 | 7/2012 | Brouk et al. | |
| 2012/0188007 A1* | 7/2012 | Van Zyl | H01J 37/32082 315/111.21 |
| 2012/0217221 A1* | 8/2012 | Hoffman et al. | 216/61 |
| 2012/0242229 A1* | 9/2012 | Hoffman | H01J 37/32082 219/121.43 |

FOREIGN PATENT DOCUMENTS

| | | | | |
|---|---|---|---|---|
| CN | 101049054 A | | 10/2007 | |
| CN | 101129100 A | | 2/2008 | |
| CN | 101330794 A | | 12/2008 | |
| EP | 0814495 A2 | | 12/1997 | |
| EP | 0814495 A2 | | 12/1997 | |
| JP | 04-193329 A | | 7/1992 | |
| JP | 2001-028298 A | | 1/2001 | |
| JP | 2001-035692 A | | 9/2001 | |
| JP | 2002153834 A | | 5/2002 | |
| JP | 2002-541672 A | | 12/2002 | |
| JP | 2006286813 A | | 10/2006 | |
| JP | 2007-305580 A | | 11/2007 | |
| JP | 2008-508430 A | | 3/2008 | |
| JP | 2008508430 A | | 3/2008 | |
| JP | 2008130503 A | * | 6/2008 | |
| JP | 4193329 B2 | | 12/2008 | |
| JP | 2009-283435 A | | 12/2009 | |
| JP | 2010-518602 A | | 5/2010 | |
| JP | 2010238981 A | | 10/2010 | |
| JP | 2011082180 A | | 4/2011 | |
| KR | 20030067961 A | | 8/2003 | |
| KR | 20090082303 | | 7/2009 | |
| KR | 101020079 B1 | | 3/2011 | |
| TW | 200405769 | | 4/2004 | |
| WO | WO 2008023523 A1 | * | 2/2008 | C23C 14/083 |
| WO | 2008091393 A2 | | 7/2008 | |
| WO | WO-2009146439 A1 | * | 12/2009 | A61B 18/042 |
| WO | 2010047970 A2 | | 4/2010 | |
| WO | WO 2010082561 A1 | * | 7/2010 | H05H 1/30 |
| WO | WO-2011119611 A2 | * | 9/2011 | C23C 14/06 |
| WO | 2012103101 A1 | | 8/2012 | |

OTHER PUBLICATIONS

"Impedance Matching." Advanced Energy Industries, Inc. (https://www.advanced-energy.com/) Fort Collins, CO, US 80525. 2006. pp. 1-12 (ENG-WHITE18-270-02P 0M Aug. 2006). (Year: 2006).*

Harold C. Ritchey. "Tuner Topics." Advanced Energy Industries, Inc. (https://www.advanced-energy.com/) Fort Collins, CO, US 80525. 2007. pp. 1-8 (ENG-WHITE16-270-02 OM Nov. 2007). (Year: 2007).*

Jeon, M., et al., "Hydrogenated amorphous silicon film as intrinsic passivation layer deposited at various temperatures using RF remote-PECVD technique", Current Applied Physics, Nov. 12, 2009, pp. S237-S240, vol. 10, (2010), Publisher: Elsevier B.V., Published in: US.

Bruno, G., et al., "Real time ellipsometry for monitoring plasma-assisted epitaxial growth of GaN", Applied Surface Sci., Jul. 7, 2006, pp. 219-223, vol. 253, (2006), Publisher: Elsevier B.V., Published in: US.

Giangregorio, M.M., et al., "Role of plasma activation in tailoring the nanostructure of multifunctional oxides thin films", Applied Surface Sci., Sep. 10, 2008, pp. 5396-5400, vol. 255, (2009), Publisher: Elsevier B.V., Published in: US.

Hoffman, D., et al., "Specification for related U.S. Appl. No. 13/425,159", filed Mar. 20, 2012, pp. 33, to be published in: US.

Vahedi, V., et al., "Verification of frequency scaling laws for capacitive radio-frequency discharges using two-dimensional simulations", Phys. Fluids B Jul. 1993, pp. 2719-2729, vol. 5, No. 7, Publisher: Am. Inst. of Physics, Published in: US.

Rauf, S., et al., "Nonlinear Dynamics of Radio Frequency Plasma Processing Reactors Powered by Multifrequency Sources", IEEE Transactions on Plasma Science, Oct. 5, 1999, pp. 1329-1338, vol. 27, No. 5, Publisher: IEEE.

Raoux, S., et al., "Remote microwave plasma source for cleaning chemical vapor deposition chambers; Technology for reducing

(56) References Cited

OTHER PUBLICATIONS global warming gas emissions", J. Vac. Sci. Technol. B Mar./Apr. 1999, p. 477-485, vol. 17, No. 2, Publisher: Am. Vacuum Soc'y, Published in: US.
Gangoli, S.P., et al., "Production and transport chemistry of atomic fluorine in remote plasma source and cylindrical reaction chamber", J. Phys. D: Appl. Phys., pp. 5140-5154, vol. 40, (2007), Publisher: IOP Publishing Ltd., Published in: UK.
Yun, Y.B., et al., "Effects of various additive gases on chemical dry etching rate enhancement of low-k SiOCH layer in F2/Ar remote plasmas", Thin Solid Films, Aug. 15, 2007, pp. 3549-3553, vol. 516, (2008), Publisher: Elsevier B.V., Published in: US.
Kuo, M.S., et al., "Influence of C4F8/Ar-based etching and H2-based remote plasma ashing processes on ultralow k materials modifications", J. Vac. Sci. Technol. B Mar./Apr. 2010, Mar. 19, 2010, pp. 284-294, vol. 28, No. 2, Publisher: Am. Vacuum Soc'y, Published in: US.
Heil, S.B.S., et al., "Deposition of TiN and HfO2 in a commercial 200 mm plasma atomic layer deposition reactor", J. Vac. Sci. Technol. A Sep./Oct. 2007, Jul. 31, 2007, pp. 1357-1366, vol. 25, No. 5, Publisher: Am. Vacuum Soc'y, Published in: US.
Kim, J.Y., et al., "Remote plasma enhanced atomic layer deposition of TiN thin films using metalorganic precursor", J. Vac. Sci. Technol. A Jan./Feb. 2004, Nov. 13, 2003, pp. 8-12, vol. 22, No. 1, Publisher: Am. Vacuum Soc'y, Published in: US.
Wakeham, S.J., et al., "Low temperature remote plasma sputtering of indium tin oxide for flexible display applications", Thin Solid Films, May 12, 2009, pp. 1355-1358, vol. 519, (2009), Publisher: Elsevier B.V.
Ohachi, T., et al., "Measurement of nitrogen atomic flux for RF-MBE growth of GaN and AlN on Si substrates", J. of Crystal Growth, pp. 2987-2991, vol. 311, (2009), Publisher: Elsevier B.V.
Honda, S., et al., "Hydrogenation of polycrystalline silicon thin films", Thin Solid Films, Oct. 5, 2005, pp. 144-148, vol. 501, (2006), Publisher: Elsevier B.V., Published in: US.
Bryns, B., et al., "A VHF driven coaxial atmospheric air plasma: electrical and optical characterization", Dec. 16, 2011, pp. 1-18, No. Rev. 2-0, Publisher: N. C. ST. U., Dep't of Nuclear Engr., Published in: US.
Rabbani, Firoozeh, International Search Report and Written Opinion re application No. PCT/US2012/022380, dated Mar. 14, 2012, Published in: AU.
Devlin, Martin, International Search Report and Written Opinion re application No. PCT/US2012/029953, dated May 28, 2012, pp. 11, Published in: AU.
O'Byrne, Melanie, "International Search Report and Written Opinion re Application No. PCT/US2012/043616", dated Oct. 17, 2012, pp. 13, Published in: AU.
Becamel, Philippe, "International Preliminary Report on Patentability re Application No. PCT/US2012/043616", dated Jan. 7, 2014, pp. 9, Published in: CH.
Emsellem, G., "Electrodeless Plasma Thruster Design Characteristics", Jul. 11, 2005, Publisher: 41st Joint Propulsion Conference, Tucson, Published in: US.
George, M.A., et al., "Silicon Nitride Arc thin Films by New Plasma Enhanced Chemical Vapor Deposition Source Technology", Jul. 7, 2011, Publisher: Article downloaded from www.generalplasma.com, Published in: US.
Krolak, M, "Matthew Krolak's MyElectricEngine.Com Megnetoplasmadynamic (MPD) Thruster Design", Apr. 28, 2011, Publisher: Webpage downloaded from http://myelectricengine.comprojects/mpdthruster/mpdthruster.html, Published in: US.
TIPO, "Search Report re Taiwan Application No. 101122763", dated Aug. 7, 2014, pp. 5, Published in: TW.
The Korean Intellectual Property Office, "Korean Office Action re Application No. 10-2013-7034881", dated Mar. 31, 2015, pp. 8, Published in: KR.
Jinzhao, Lin, "Chinese Office Action re Application No. 201280040741.1", dated Jun. 26, 2015, pp. 24, Published in: CN.
Fujimoto, Kayoko, "JP Office Action re Application No. 2014518666", dated Aug. 28, 2015, pp. 14, Published in: JP.
SIPO, "Chinese Office Action re Application No. 201280040741.1", dated Mar. 8, 2016, pp. 25, Published in: CN.
Wang, Ying, "Response to Chinese Office Action re Application No. 2012800407411", dated Apr. 19, 2016, pp. 7, Published in: CN.
Yamamoto, Shusaku, "Response to Japanese Office Action re Application No. 2014-518666", dated Dec. 28, 2015, pp. 6, Published in: JP.
SIPO, "Chinese Office Action re Application No. 201280040741.1", dated Aug. 10, 2016, pp. 23, Published in: CN.
Fujimoto, Kayoko, "Japanese Office Action re Application No. 2014-518666", dated May 30, 2016, pp. 8, Published in: JP.,
SIPO, "Chinese Office Action Re Application No. 201280040741.1", dated Mar. 21, 2017, pp. 14, Published in: CN.
Lee, Min-Hyung, "Korean Office Action Re Application No. 2016-7004363", dated Nov. 4, 2016, pp. 13, Published in: KR.

\* cited by examiner

PROJECTED PLASMA SOURCE

FIELD OF THE DISCLOSURE

The present disclosure relates generally to plasma sources. In particular, but not by way of limitation, the present disclosure relates to systems, methods and apparatuses for generating a plasma remotely from a processing chamber.

BACKGROUND

Plasma processing often involves direct plasma interaction with a substrate and plasma cleaning often involves interaction between plasma-created radicals and surfaces of a processing chamber. In the processing context plasma is typically created in the processing chamber using high voltages, and thus the plasma is highly energized. High energy ions in the plasma bombard surfaces and materials in the chamber and can cause unwanted etching or unwanted deposition. Also, in some chemical etching applications high ion energies are not desirable. For cleaning purposes, radicals are often formed in a plasma within the processing chamber, but here again the high energy ions may detrimentally etch the processing chamber.

Remote plasma sources, where a plasma is generated in a chamber separate from the processing chamber, can overcome the high ion energy problem. Gas can be passed through the remote plasma and form the radicals that are fed into the processing chamber for cleaning the chamber or for chemical etching. However, the radicals decay en route to the chamber and thus a less-than-ideal mixture and density of radicals reaches the chamber.

SUMMARY

Exemplary embodiments of the present disclosure that are shown in the drawings are summarized below. These and other embodiments are more fully described in the Detailed Description section. It is to be understood, however, that there is no intention to limit the disclosure to the forms described in this Summary or in the Detailed Description. One skilled in the art can recognize that there are numerous modifications, equivalents and alternative constructions that fall within the spirit and scope of the disclosure as expressed in the claims.

Some embodiments of the disclosure may be characterized as an apparatus that includes a field generation portion that generates a plasma and an ionizing electromagnetic field that extends out of the field generation portion. A field projection portion is coupled to the field generation portion, and the field projection portion attenuates the ionizing electromagnetic field as it passes through the field projection portion to generate an attenuated ionizing electromagnetic field. A receiving portion receives the attenuated ionizing electromagnetic field and sustains a plasma within the receiving portion with the attenuated ionizing electromagnetic field.

Other embodiments may be characterized as a plasma source that includes a field generation portion that generates an ionizing electromagnetic field that extends into a field projection portion and a field projection portion that attenuates the ionizing electromagnetic field to form an attenuated ionizing electromagnetic field with sufficient energy to sustain a plasma within a receiving portion coupled to the field projection portion.

As previously stated, the above-described embodiments and implementations are for illustration purposes only. Numerous other embodiments, implementations, and details of the disclosure are easily recognized by those of skill in the art from the following descriptions and claims.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

DETAILED DESCRIPTION

Figure 1:
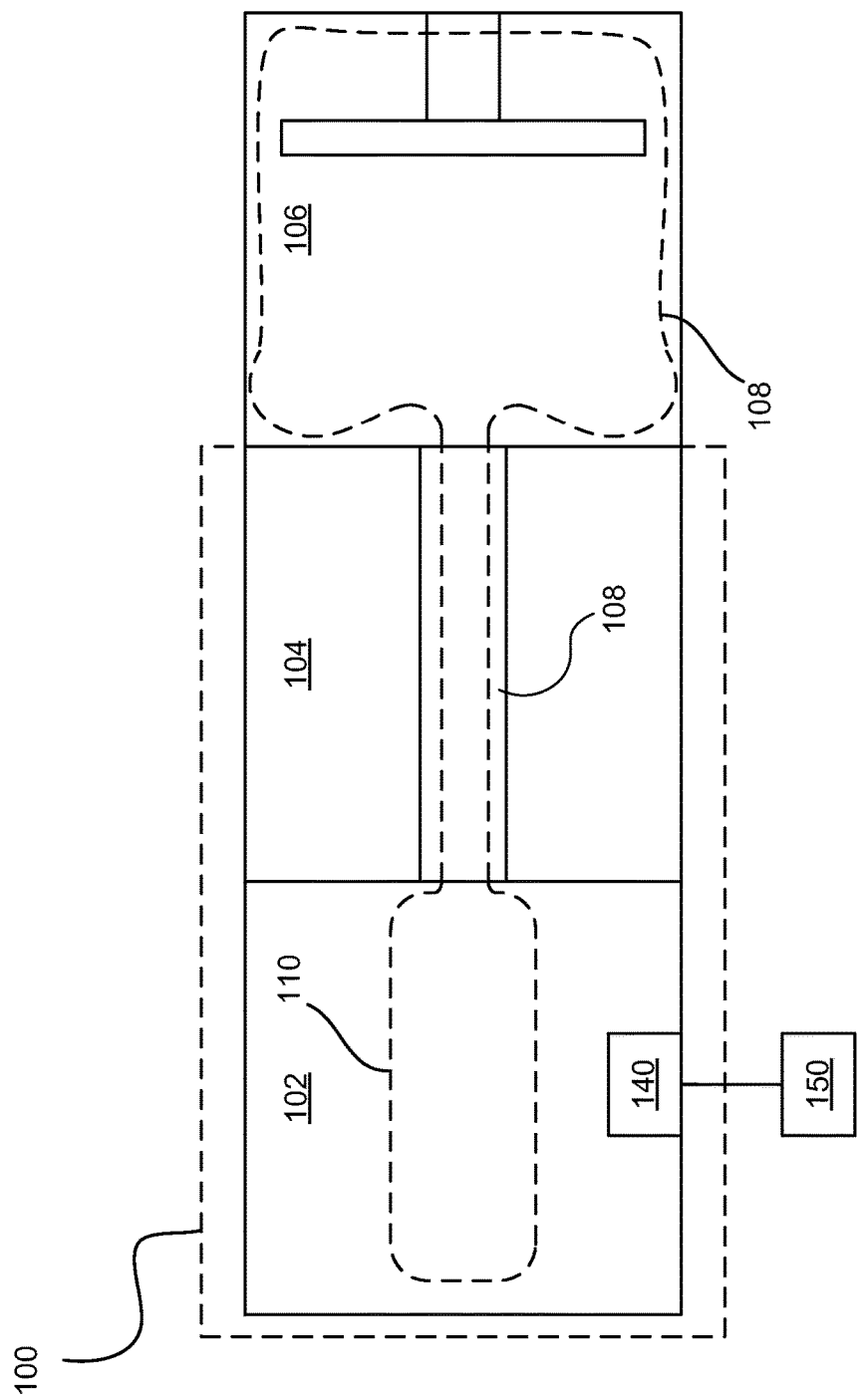
FIG. 1 illustrates an embodiment of a projected plasma source.

FIG. 1 illustrates an embodiment of a projected plasma source 100. The projected plasma source 100 can include a field generation portion 102 and a field projection portion 104, and the projected plasma source 100 can be coupled to a receiving portion 106.

The field generation portion 102 ignites and sustains a first portion of a plasma 110 via an ionizing electromagnetic field (e.g., electric, magnetic, or combination of the two) that extends or projects through a field projection portion 104 to the receiving portion 106. The field can couple into the first portion of the plasma 110, once ignited, via inductive or electrostatic (capacitive) means, or via a combination of the two. The field is generated via energy provided from a power source 140 that is controlled via control circuitry or logic 150. The power source 140 can be realized by one or more power supplies providing AC, pulsed DC, or other time-varying currents and voltages as well as DC current and voltage. The ionizing electromagnetic field can be controllably attenuated in the field projection portion 104 to form an attenuated ionizing electromagnetic field. The ionizing electromagnetic field can be considered the attenuated ionizing electromagnetic field for instance, within the receiving portion 106. The attenuated ionizing electromagnetic field can extend into the receiving portion 106 and can retain sufficient energy to sustain a second portion of the plasma 108. The second portion of the plasma 108 can also exist within the receiving portion 106. This second portion of the plasma 108 can have low energy and can be used in one or more processing steps of the receiving portion 106 (e.g., substrate etching or generation of radicals for chamber cleaning, to name two).

The ionizing electromagnetic field can have a strength sufficient to ionize at least some particles and sustain a plasma. The ionizing electromagnetic field may have a field strength that varies by location. For example the ionizing electromagnetic field in the field generation portion 102 may be stronger than the ionizing electromagnetic field in the field projection portion 104, which may be stronger than the ionizing electromagnetic field in the receiving portion 106. For purposes of this disclosure, a plasma is sustained by maintaining a desired plasma density (also known as electron or ion density), or by maintaining a rate of ionization that exceeds the rate of electron-ion recombination by a desired value. In an embodiment, a plasma is sustained when there is a plasma density of $10^8$ to $10^{13}$ free electrons per $cm^3$.

The plasma density can drop off or decrease near edges or surfaces within the remote projection source 100 and the receiving portion 106, in a region called a sheath 108. The sheath 108 is a region of plasma having a net positive charge due to a greater density of ions than electrons. A substantial percentage of voltage drops across the sheath due to strong electric fields in the sheath resulting from charge imbalance. The high field strength can be responsible for accelerating electrons into the plasma where they can impact neutral atoms and molecules in the plasma and ionize them. Thus, the field strength in the sheath 108 can be responsible for accelerating electrons that ionize gas within the receiving portion 106 and sustain the second portion of the plasma 108. The sheath 108 can exist in the generation portion 102, the field projection portion 104, and in the receiving portion 106.

The field generation portion 102 can operate at a range of AC frequencies, for instance in the VHF range, but can also sustain the first and second portions of the plasma 108, 110 via DC or pulsed-DC fields. The power, frequency, DC and/or AC bias, pulse width, and pulse modulation, along with other electrical characteristics of the field generation portion 102 can be controlled via the control circuitry or logic 150, which can be embodied in hardware, software, firmware, or a combination of these. One skilled in the art will recognize that the control circuitry or logic 150 can be used with any of the embodiments that will be discussed in more depth later in this disclosure. Sensors for detecting plasma density or field strength (e.g., within the receiving portion 106) can be in communication with the control circuitry or logic 150 such that the field generation portion 102 operates as a feedback or feedforward system. Detailed descriptions and figures of various non-limiting embodiments of field generation portions 102 will be discussed with reference to FIGS. 2-5.

The field projection portion 104 is a path (e.g., a grounded conductive tube with an inner surface made of a dielectric) wherein a voltage in the first portion of the plasma 110 can be attenuated en route to the receiving portion 106. In an embodiment, the voltage in the second portion of the plasma 108 can be attenuated to a level lower than the voltage in the first portion of the plasma 110, but still large enough to sustain the second portion of the plasma 108 in the receiving portion 106. The field projection portion 104 can be a tube or other pathway having dimensions such that it attenuates the electromagnetic field that extends through it. Detailed descriptions and figures of various non-limiting embodiments of field projection portions 104 will be discussed with reference to FIGS. 6a, 6b, 6c.

The receiving portion 106 can receive the ionizing electromagnetic field from the field projection portion 104. An exemplary receiving portion 106 is a processing chamber where the second portion of the plasma 108, free radicals, or both, can interact with a semiconductor or other substrate to carry out one or more processing steps (e.g., plasma enhanced etching, plasma enhanced chemical vapor deposition, or plasma sputtering, to name a few non-limiting examples). Detailed descriptions and figures of various non-limiting embodiments of receiving portion 106 will be discussed with reference to FIGS. 7-8.

The details of FIG. 1 are for illustrative purposes only and are not meant to limit the embodiments of each portion to the structures illustrated. Specific embodiments of each portion will be described in detail in the following discussions of FIGS. 2-8. Each figure will focus on an embodiment of one of the three portions 102, 104, 106 and it is to be understood that in many instances embodiments of each portion 102, 104, 106 are interchangeable with each other.

One advantage of the remote projected source 100 and other embodiments discussed with reference to the other figures, is that the degrading effects of a high voltage plasma can be avoided within the processing chamber when plasma is desired in the chamber (e.g., for etching or creating radicals for chamber cleaning), while in low-ion-energy etching applications, a low-voltage plasma enables lower ion energy distributions. Furthermore, high frequency plasmas (e.g., 5-300 MHz) can be used in processing chambers that are only built for low frequency plasma.

Low energy ion applications such as chemical etching and ion-assisted deposition may not be compatible with the hundreds or thousands of volts often used to generate a plasma. No matter how low a sputtering or etching substrate holder bias is set to, for instance, ions will still have a significant portion of the energy used to generate them. Thus, a lower limit to ion energy may be set by the plasma generation energy rather than by the sputtering or etching bias on the substrate. By remotely generating high voltage fields and projecting them into the processing chamber, plasma can be generated and sustained within the processing chamber, but with orders of magnitude lower voltage (e.g., 0.5 V-10 V). With such projected and attenuated fields, the low limit of the ion energy distribution can be set independently of the plasma generation voltage.

Very high frequency (VHF) plasmas (e.g., 60 MHz) have a number of advantages, but when plasma is formed at VHF, the VHF waves in the plasma may require a more expensive and complex processing chamber to handle the VHF. For instance, the shorter wavelengths of VHF energy may be on the order of the size of a chamber window and thus able to escape the chamber. VHF chambers have smaller windows and other modifications that allow them to contain VHF radiation and last longer under the stresses of such radiation. By generating a plasma using projected fields that are attenuated when they reach the processing chamber, low frequency chambers can be used even where the remote plasma source generates the plasma using VHF energy.

Figure 2:
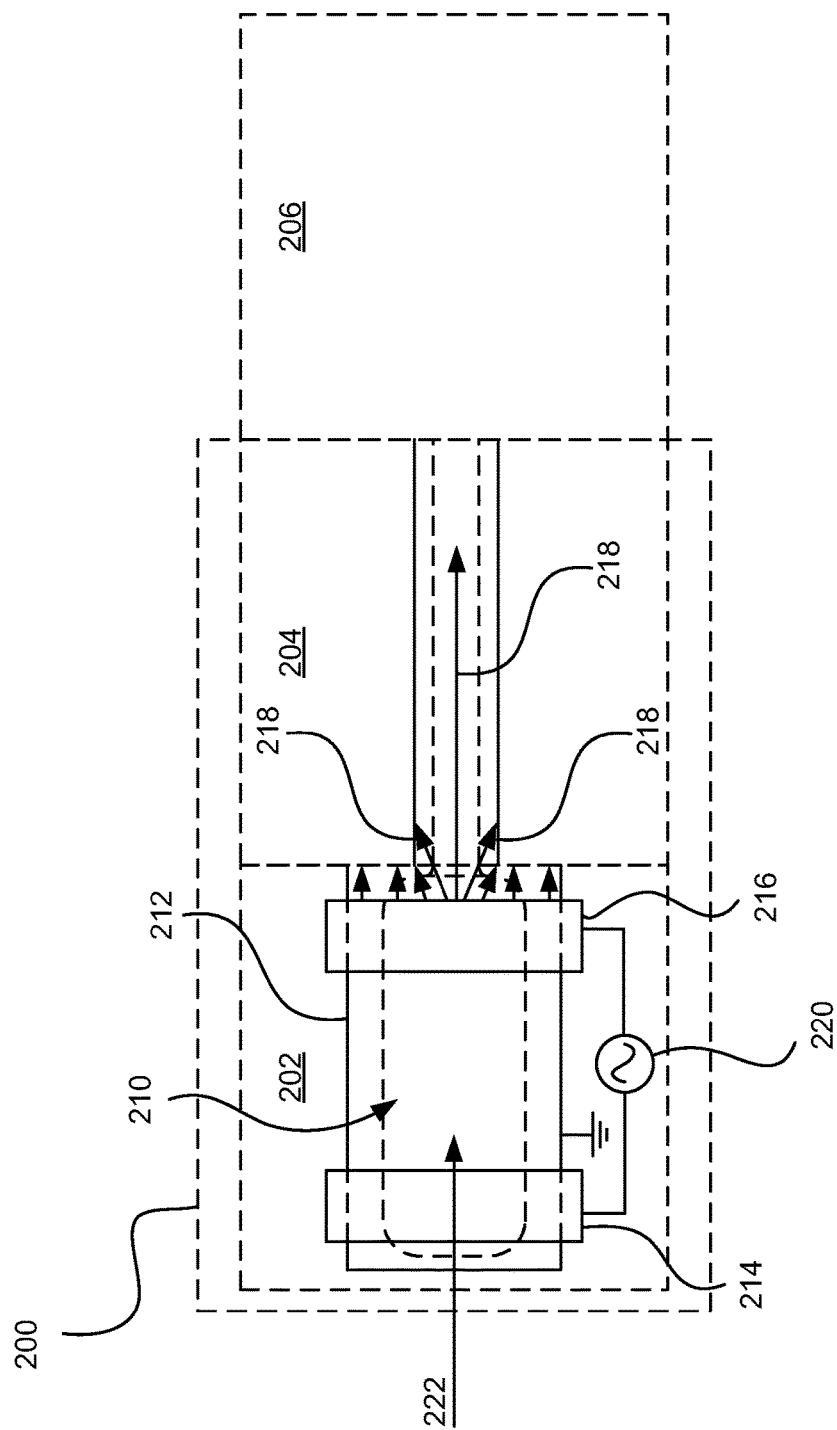
FIG. 2 illustrates another embodiment of a projected plasma source.

FIG. 2 illustrates another embodiment of a projected plasma source 200. The projected plasma source 200 has a field generation portion 202 having two electrodes 214, 216 that electrostatically couple energy into a first portion of the plasma 210 both for ignition of the first portion of the plasma 210 and generation of an ionizing electric field 218. The ionizing electric field 218 extends through a field projection portion 204 to a receiving portion 206. A non-activated gas 222 can be fed into a plasma generation chamber 212 where a power source 220 can apply power (e.g., a voltage) to a first electrode 214 and a second electrode 216 to electrostatically (capacitively) ionize at least a portion of the gas 222 and ignite the first portion of the plasma 210. A current loop through the power source 220 and the electrodes 214, 216 can be completed via the first portion of the plasma 210, which is conductive once ignited. Both electrodes 214, 216 can encircle or wrap around the plasma generation chamber 212.

The ionizing electric field 218 extends or is projected from the electrode 216 towards any lower-potential surfaces. In the illustrated embodiment, the field projection portion 204 can be grounded or biased (DC or AC or pulsed DC) at a lower potential than the electrode 216, and thus the field 218 can extend from the electrode 216 to various portions of the field projection portion 204. The receiving portion 206 can also be grounded or at a lower potential than the electrode 216 and thus the field 218 can extend to the receiving portion 206. Since plasma is generally charge neutral, a voltage potential difference and thus the start of the ionizing electric field 218 may coincide with the interface between the generation portion 202 and the field projection portion 204.

In the exemplary embodiment depicted in FIG. 2, the ionizing electric field 218 that generates and sustains the first portion of the plasma 210 extends or is projected from the field generation portion 202 to the receiving portion 206 such that a second portion of the plasma (e.g., the second portion 108 of FIG. 1) can be generated and sustained in the receiving portion 206 remotely from the electrodes 214, 216 and the strongest portions of the ionizing electric field 218. The ionizing electric field 218 may also project ions from the field generation portion 202 to the receiving portion 206. However, under certain circumstances the force of the gas 222 passing through the generation portion 202 can have a larger effect on the movement of ions and non-charged particles towards the receiving portion 206 than the ionizing electric field 218. At the same time, the ionizing electric field 218 that reaches the receiving portion 206 continues to ionize at least a portion the gas 222 that is pushed into the receiving portion 206 and maintain ionizing of ionized particles.

While the power source 220 is illustrated as an AC (e.g., RF) source, in some variations the power source 220 can be a DC or pulsed DC power source. The power source 220 can be a voltage or current source, for example. In some embodiments, high or low frequency RF can be applied to or coupled into the first portion of the plasma 210, and in a particular embodiment, frequencies can be in the VHF range. RF frequencies can include the range 10 kHz to 1 GHz, 2-500 MHz, or 30-150 MHz. Some common plasma processing frequencies include 450 kHz, 2 MHz, 4 MHz, 13.56 MHz, and 27.12 MHz. In an embodiment, a single RF frequency can be coupled into the first portion of the plasma 210 at the generation portion 202, and in another embodiment, two or more RF frequencies can be coupled into the first portion of the plasma 210. In an alternative embodiment, the first and second electrodes 214, 216 can be coupled via an inductor (not illustrated) generating a magnetic field that inductively couples power into the first portion of the plasma 210. The inductor can be connected in parallel with the illustrated power source 220.

The plasma generation chamber 212 can be sized or have a cross section to match the cross section of the field projection portion 204, although as illustrated, the plasma generation chamber 212 has a larger cross section than a tube of the field projection portion 204. The plasma generation chamber 212 can also have a shape that enhances gas 222 flow into the field projection section 204 (e.g., a shape that matches that of the field projection portion 204). In an embodiment, the plasma generation chamber 212 includes a dielectric such as glass. In the illustrated embodiment, the plasma generation chamber 212 is grounded, but it can also be floating or biased (e.g., a DC, AC, or pulsed DC bias).

The second electrode 216 can generate an ionizing electric field 218 and be arranged either flush with the field projection portion 204 or offset from the field projection portion 204 as illustrated. A voltage at the interface between the field generation portion 202 and the field projection portion 204 can be large enough to sustain a plasma within the receiving portion 206. In other words, a sufficient density of plasma can be sustained within at least a portion of the receiving portion 206. This can be facilitated by either a sufficiently-large ionizing electric field 218 or by generating a greater plasma density in the field generation portion 202. In an embodiment, a voltage at the interface between the field generation portion 202 and the field projection portion 204 is large enough to sustain a plasma density of at least $10^9$ free electrons per $cm^3$, and up to $10^{13}$ free electrons per $cm^3$, at the interface between the field projection portion 204 and the receiving portion 206 or in at least a portion of the receiving portion 206.

Figure 3:
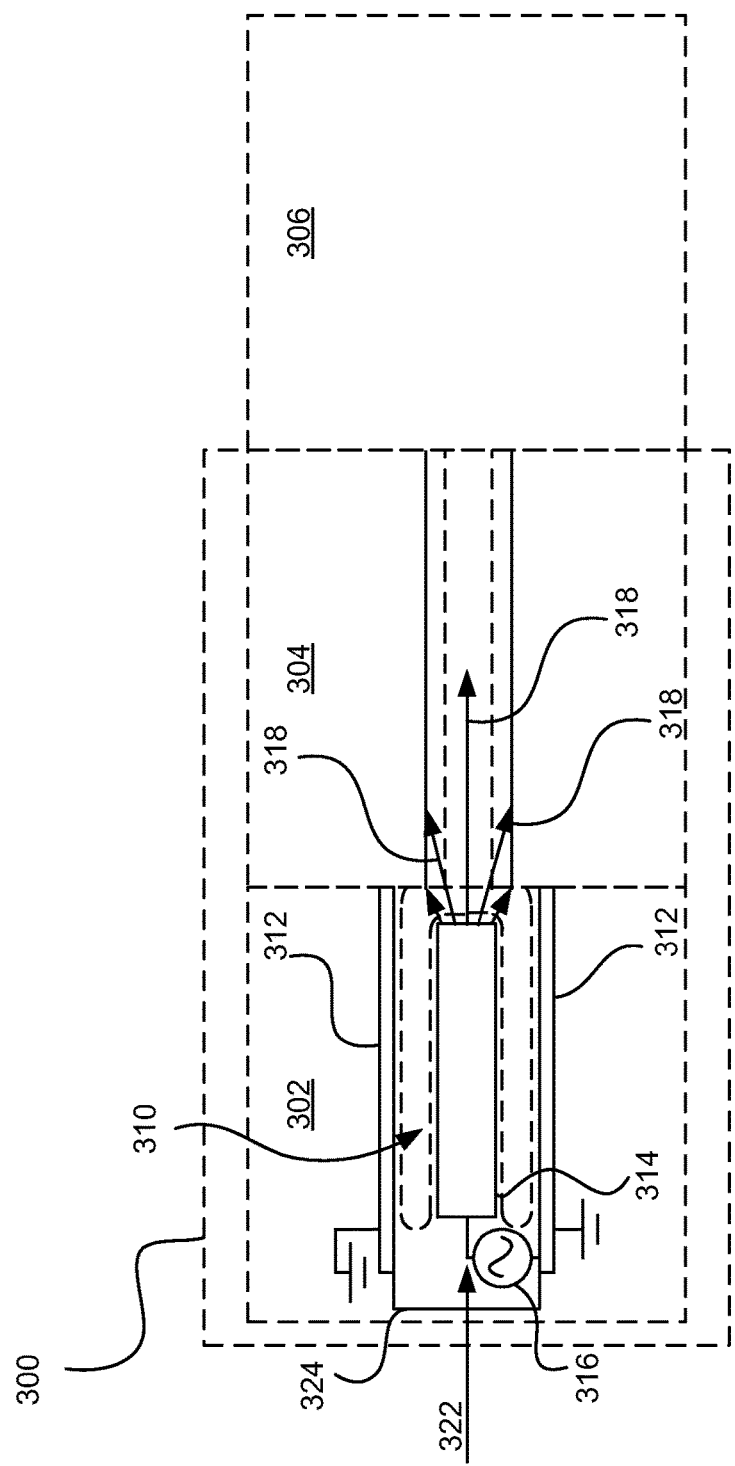
FIG. 3 illustrates yet another embodiment of projected plasma source.

FIG. 3 illustrates yet another embodiment of a projected plasma source 300. The projected plasma source 300 includes a field generation portion 302 having a central electrode 314 and a perimeter electrode 312 that together electrostatically couple energy into a first portion of a plasma 310 to both ignite and sustain the first portion of the plasma 310. The electrodes 312, 314 also generate an ionizing electric field 318 that extends or projects into a receiving portion 306. A power source 316 generates a current between the central electrode 314 and the perimeter electrode 312 of a plasma generation chamber 324. The perimeter electrode 312 can be part of an outer surface or enveloping surface of the plasma generation chamber 324. The perimeter electrode 312 can be grounded as illustrated, or can be floating or AC, DC, or pulsed DC biased. The central electrode 314 can be axially arranged in the plasma generation chamber 324. Non-activated gas 322 can pass into the plasma generation chamber 324 and be at least partially ionized by the ionizing electric field 318 generated by a voltage between the central electrode 314 and the perimeter electrode 312. This ionizing electric field 318 can include radial components when the plasma generation chamber 324 is tubular. The plasma generation chamber 324 can also be rectangular or have a square cross section, to name two other non-limiting examples.

The plasma generation chamber 324 can be shaped and sized to match the cross section of the field projection portion 304. In the illustrated embodiment, the plasma generation chamber 324 diameter is larger than that of a tube of the field projection portion 304. In other embodiments, the chamber 324 diameter can be less than or equal to the diameter of the tube of the field projection portion 304.

The illustrated electric field lines of the electric field 318 are illustrative only and should not be interpreted as having a limiting shape. For instance, in some variations a more accurate rendition of the electric field lines might show an inflection point in the electric field lines at edges of the plasma, for instance where the electric field lines enter the sheath region. Also, the shape of the first portion of the plasma 310 is illustrative only and should not be interpreted as a limitation. While the power source 316 is illustrated as an AC (e.g., RF) source, in some variations the power source 316 can be a DC or pulsed DC power source. The power source 316 can be a voltage or current source, for example.

Figure 4:
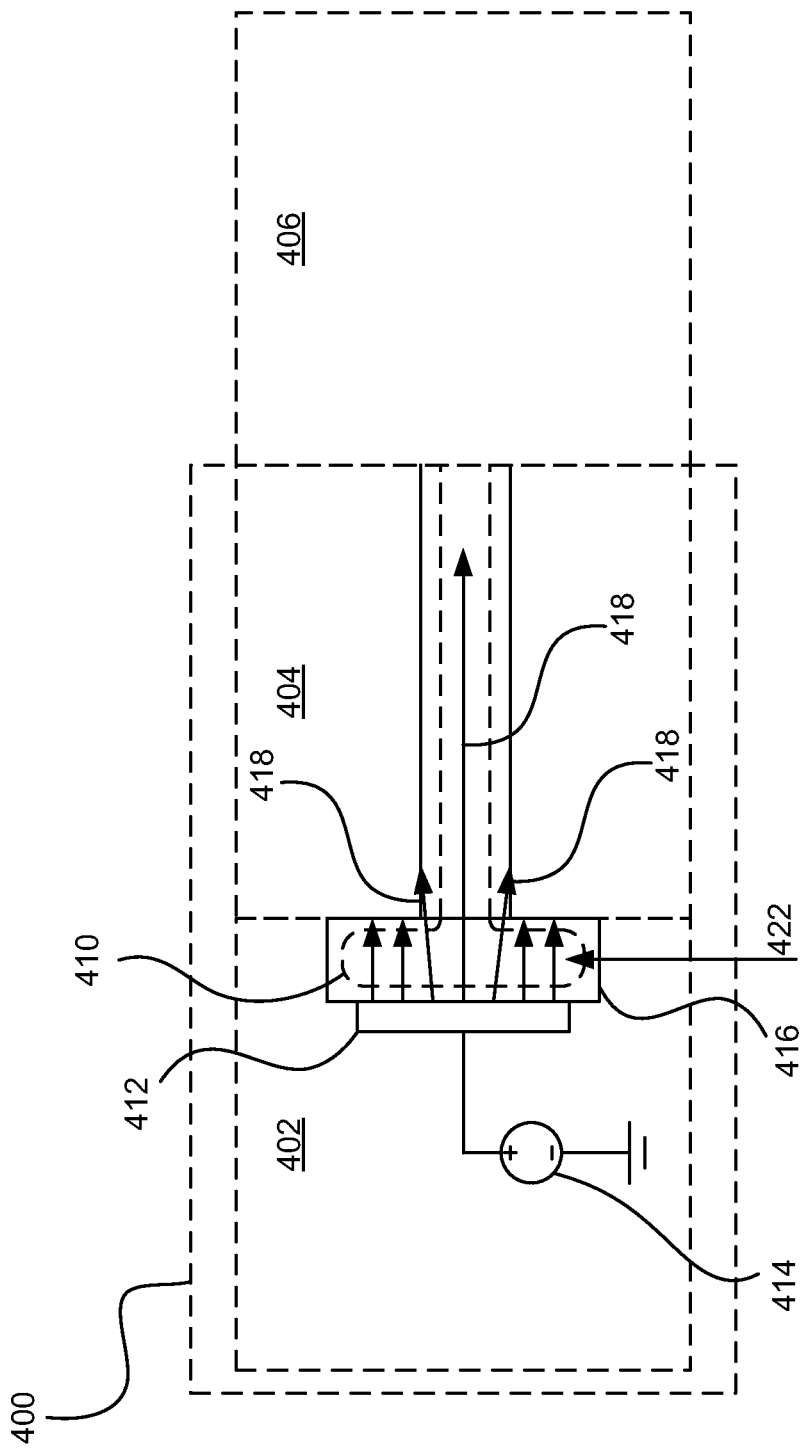
FIG. 4 illustrates still another embodiment of projected plasma.

FIG. 4 illustrates still another embodiment of a projected plasma source 400. The projected plasma source 400 includes a field generation portion 402 having a single electrode 412 that electrostatically couples energy into a first portion of a plasma 410 to ignite and sustain the first portion of the plasma 410. The electrode 412 also generates an ionizing electric field 418 that extends or projects into the receiving portion 406. A non-activated gas 422 can be fed into a plasma generation chamber 416 as illustrated, or via a conduit that passes through the electrode 412 and is perpendicular to the electrode 412. In some variations the power source 414 can be AC, pulsed AC, or DC. The power source 414 can be a voltage or current source, for example.

In some implementations of the exemplary embodiment, the electrode 412 can form one of two capacitive electrodes with the second being formed from a substrate holder of the receiving portion 406. The second electrode can also be distributed between the substrate holder, a substrate, and walls or other lower potential surfaces of the receiving portion 406 and the field projection portion 404. The electrode 412 can generate a voltage at the interface between the field generation portion 402 and the field projection portion 404 where the voltage decreases as a function of distance from the electrode 412. The electrode 412 is illustrated as being coupled to an outside of the plasma generation chamber 416, but in variations can form an outer surface of the plasma generation chamber 416, or can be arranged within the plasma generation chamber 416. The plasma generation chamber 416 is illustrated as having a greater cross section or diameter than that of a tube of the field projection portion 404; however in some embodiments the plasma generation chamber 416 can be shaped and sized to match a cross section of the tube of the field projection portion 404. Moreover, the illustrated plasma 410 shape is merely illustrative and should not be interpreted as a limitation.

The ionizing electric field 418 is directed from the electrode 412 towards any surfaces having a lower potential. For instance, in the illustrated embodiment, the field projection portion 404 comprises a tube at a lower potential (e.g., grounded) than the electrode 412, and thus the ionizing electric field 418 is directed axially down the field projection portion 404 tube as well as into the tube sidewalls. This example is merely illustrative, and many other embodiments include features and structure that can affect the ionizing electric field 418 field lines in various alternative fashions.

Figure 5:
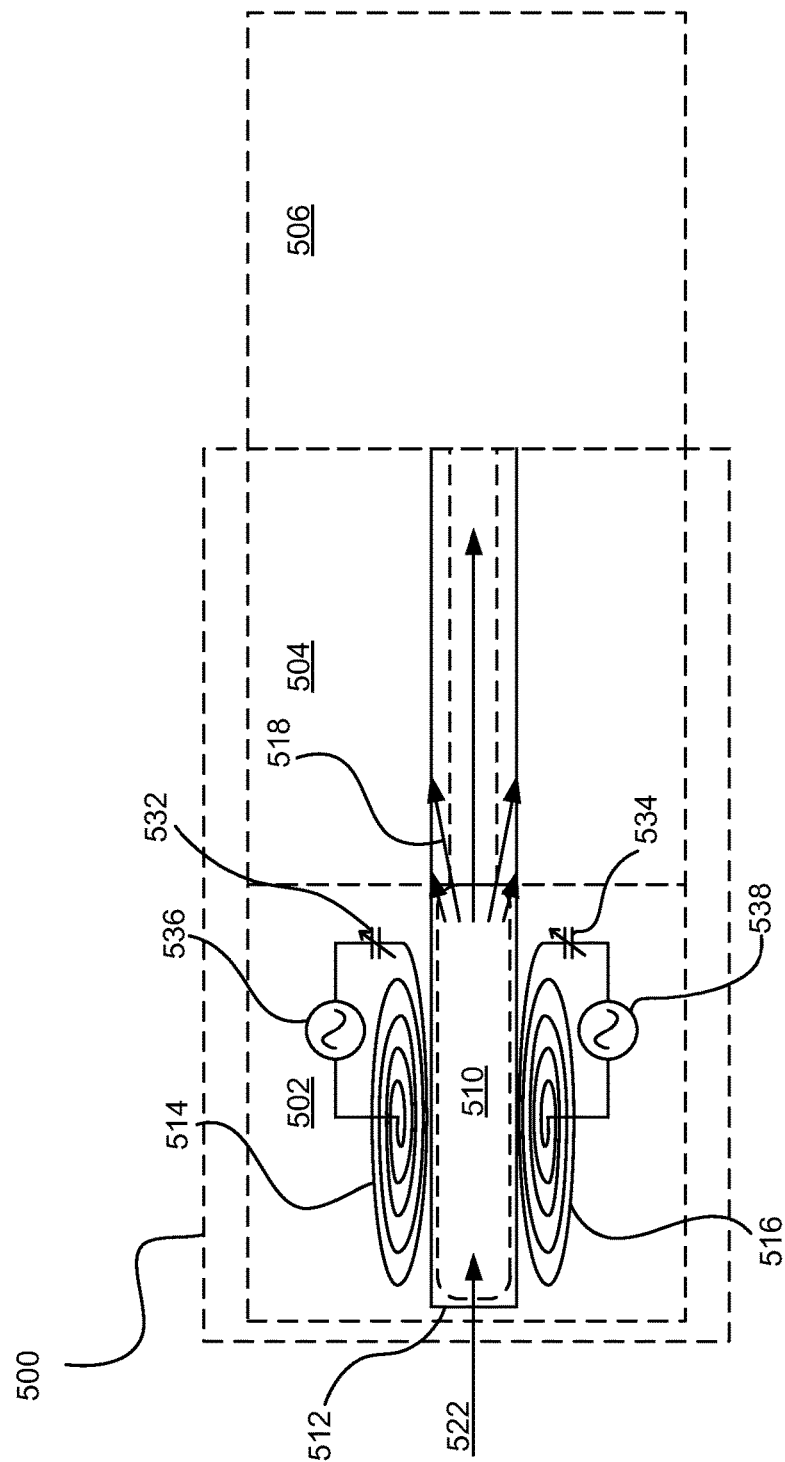
FIG. 5 illustrates another embodiment of a projected plasma source.

FIG. 5 illustrates another embodiment of a projected plasma source 500. The projected plasma source 500 has a field generation portion 502 that can inductively (and somewhat capacitively) couple to a first portion of a plasma 510 and generate an ionizing electric field 518 that extends or projects into the receiving portion 506. The field generation portion 502 includes two inductors 514, 516 to inductively sustain the plasma 510. As shown, a non-activated gas 522 is fed into a plasma generation chamber 512 and AC current passing through the first and second inductors 514, 516 inductively couples power into the first portion of the plasma 510 to sustain the first portion of the plasma 510 and ionize at least a portion of the gas 522. Inductive coupling is the result of an AC (e.g., RF), pulsed DC, or any other time-varying current being passed through each of the inductors 514, 516, and is generated by power sources 536, 538.

The power sources 536, 538 can generate a radial bias on the inductors 514, 516 (e.g., highest potential on an outermost loop of each inductor 514, 516 and gradually decreasing potential on each smaller-diameter loop) such that an ionizing electric field 518 is generated that extends or projects towards and into the receiving portion 506 with enough energy to sustain a plasma within the receiving portion 506. Such a bias can be established via variable capacitors 532, 534, although non-variable capacitors can also be used. The variable capacitors 532, 534 can control the potential between outer and inner loops of the inductors 514, 516 (e.g., via control circuitry or logic 150 as described with reference to FIG. 1) and consequently control the ionizing electric field strength 518, which in turn controls the plasma density within the receiving portion 506.

A non-activated gas 522 can be fed into the plasma generation chamber 512 wherein AC current passing through the first and second inductors 514, 516 inductively couples into first portion of the plasma 510 to sustain the first portion of the plasma 510 and ionize at least a portion of the gas 522.

The ionizing electric field 518 can be generated via a potential difference between outer loops of each of the inductors 514, 516 and the field projection portion 504 and/or the receiving portion 506. For instance, where the field projection portion 504 is a grounded conductive tube, outer loops of the inductors 514, 516 will be at a higher potential than the field projection portion 504 and thus the ionizing electric field 518 will be directed from the inductors 514, 516 to portions of the field projection portion 504 (e.g., walls of a conductive tube). In another example, the receiving portion 506 may also be grounded such that the ionizing electric field 518 is directed towards the field projection portion 504 and the receiving portion 506. The center of the inductors 514, 516 (innermost loops) can be at a higher or lower potential than the outer loops of the inductors 514, 516. However, whatever the potential difference between the central loops of the inductors 514, 516 and the outer loops, the outer loops are at a higher potential than the field projection portion 504 and the receiving portion 506. As such, the inductors 514, 516 generate the ionizing electric field 518 that extends or projects into the receiving portion 506.

The inductors 514, 516 of the illustrated embodiment are angled slightly for illustrative purposes only. In implementation, the two inductors 514, 516 are parallel to each other, to the plasma generation chamber 512, and to first portion of the plasma 510. In an embodiment, the first and second inductors 514, 516 are spiral-shaped conductors comprising a plurality of coils or loops, and are in planar arrangements, where a plane through the first inductor 514 is parallel to a plane through the second inductor 516. In this embodiment, power primarily couples inductively to the first portion of the plasma 510, although capacitive coupling also can occur and can be used for ignition. While the inductors are illustrated as separate and as having separate power sources 536, 538, they can also be conductively coupled and/or biased via a single power source (e.g., power source 536).

Various embodiments of a plasma generating portion 502 utilizing inductive coupling via two inductors 514, 516 are described in greater detail in provisional patent application 61/466,024, which is incorporated herein by reference.

As illustrated, there can be an offset, space, or gap between the inductors 514, 516 and the field projection portion 504. Such a gap can diminish the ionizing electric field 518 strength at the interface between the field generation portion 502 and the field projection portion 504. If the inductors 514, 516 are arranged closer to the field projection portion 504 such that the gap is reduced or eliminated, then a stronger ionizing electric field 518 can exist in the field projection portion 504 and in the receiving portion 506.

Although the illustrated embodiment shows each of the inductors being capacitively biased, in variations, only one of the inductors 514, 516 is capacitively biased. While capacitors 532 and 534 are illustrated, other types of reactive impedances can replace the capacitors 532, 534 (e.g., inductors). Although not illustrated, a dielectric can be arranged between each of the inductors 514, 516 and first portion of the plasma 510. For instance an inner surface of the plasma generation chamber 512 can be coated in a dielectric. The chamber 512 can even be partially made from a dielectric. The ionizing electric field 518 and plasma 510 shapes are illustrative only and should not be interpreted as limiting.

Figure 6A:
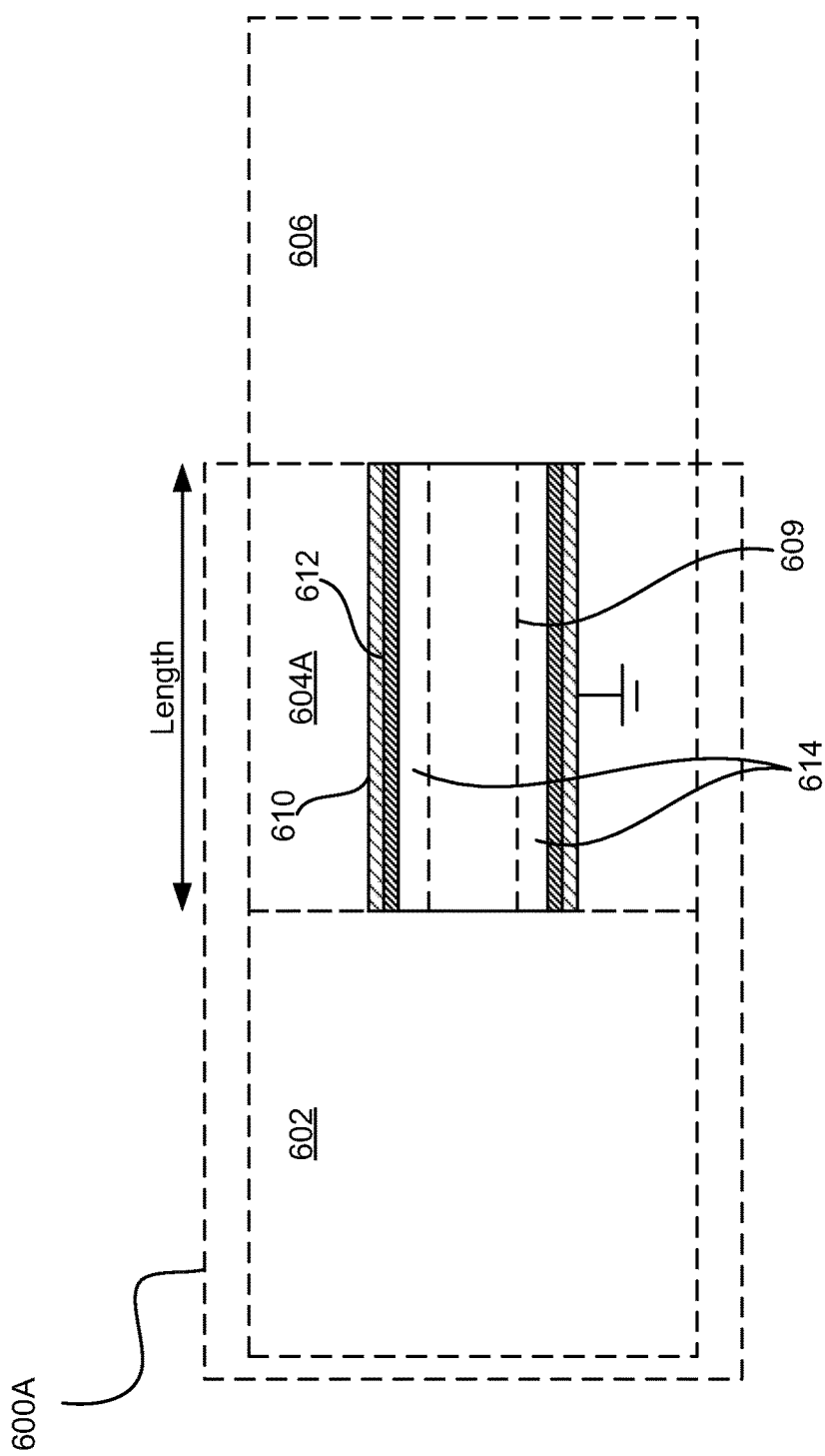
FIG. 6a illustrates an embodiment a field projection portion of a projected plasma source.

FIG. 6a illustrates an embodiment a field projection portion 604A of a projected plasma source 600. The projected plasma source 600A has a field projection portion 604A comprising a grounded conductive tube 610 with a dielectric layer 612 between a third portion of a plasma 609 and the conductive tube 610. An ionizing electric field generated in the field generation portion 602 extends or is projected into and through the field projection portion 604A and then into the receiving portion 606. The field strength at the interface between the field generation portion 602 and the field projection portion 604A can be greater than the field strength at the interface between the field projection portion 604A and the receiving portion 606. The field strength decays or is attenuated during passage through the field projection portion 604A, and this attenuation is controllable. At one extreme, the attenuation can be negligible, while at the other extreme, the attenuation can cause the field strength to attenuate to a level just large enough to sustain a second portion of the plasma in the receiving portion 606. A controller or other mechanism can be used to controllably set the attenuation to any level within this range.

The attenuation can be controlled by the length of the field projection portion 604A, by the field projection portion 604A cross section (e.g., height and width), and/or by the dielectric 612. For example, changing the field projection portion 604A to include one or more of a greater length, smaller cross section, higher dielectric constant, and greater dielectric thickness, will cause greater attenuation. Additionally, if less than the entire inner surface of the grounded conductive tube 610 is covered by the dielectric 612, then attenuation will be smaller. A decreased cross section not only attenuates the field strength, but the gas pressure increases, which causes a higher rate of particle collisions which can quench the plasma and decrease plasma density (e.g., at high electron energies electron collisions tend to be ionizing, while at lower electron energies, collisions tend to lead to electron absorption). Thus, a desired plasma density at the interface of the field projection portion 604A and the receiving portion 606 can be selected and varied based on the above-mentioned parameters. The above-mentioned parameters can also control a sheath 614 thickness, where the sheath 614 is a region of plasma having a net positive charge due to a greater density of ions than electrons. The sheath 614 thickness can be modified in order to control a plasma density within the receiving portion 606.

The grounded conductive tube 610 can also have shapes other than a tube, such as a square, rectangular, or ovular cross section, to name just a few non-limiting examples. The conductive tube 610 is illustrated as being grounded, but may also be floating, or have a DC bias.

Figure 6B:
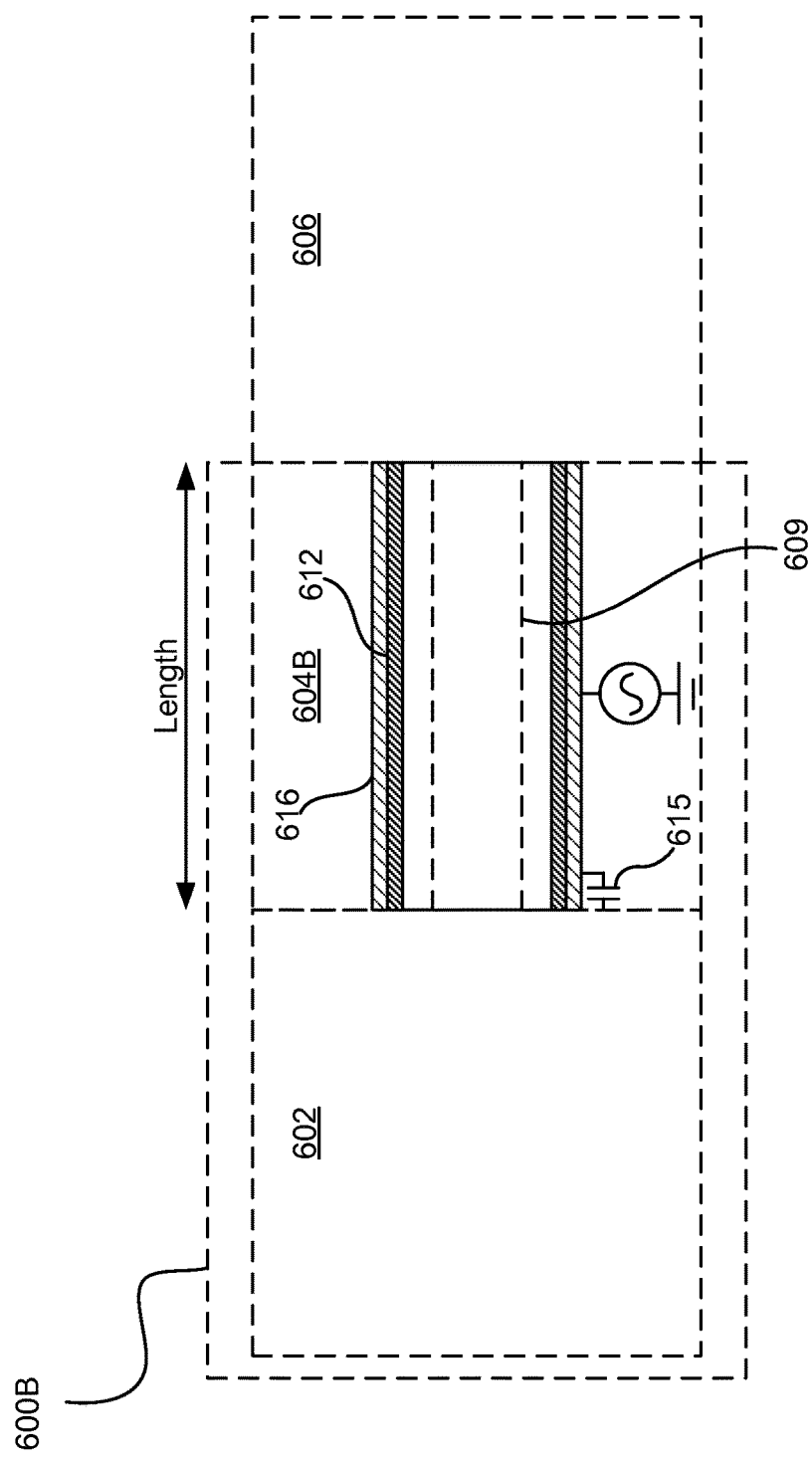
FIG. 6b illustrates another embodiment of afield projection portion of a projected plasma source.

FIG. 6b illustrates another embodiment of a field projection portion 604B of a projected plasma source 600B. The projected plasma source 600B can have a field projection portion 604B comprising a biased conductive tube 616 with a dielectric layer 612 between the third portion of the plasma 609 and the biased conductive tube 616. The biased conductive tube 616 can have an AC bias (as illustrated) that is phase shifted from the AC applied in the field generation portion 602, where the phase shift can be selected so that an additional electric field component enhances the electric field strength reaching the receiving portion 606. Additional field strength may enable greater plasma densities in the receiving portion 606. The AC bias can be controlled via control circuitry or logic such as that discussed with reference to FIG. 1. The control circuitry or logic can be in communication with one or more sensors within the projected plasma source 600B and/or the receiving portion 606 in order to provide feedback or feedforward control of the AC bias. In a variation, no bias is applied to the conductive tube 616, and instead the conductive tube 616 is floating.

The biased conductive tube 616 can be flush with an opening in the receiving portion 606. However, in an embodiment, a portion of the biased conductive tube 616 can extend into the receiving portion 606. Such extension can help keep the third portion of the plasma 609 from interacting with the inner walls of the receiving portion 606. Additionally, magnetic fields can enhance confinement of the third portion of the plasma 609 within the field projection portion 604B (e.g., coaxial magnetic fields). Coaxial magnetic fields can also be used to enhance field extension and projection into the receiving portion 606.

The biased conductive tube 616 may be electrically isolated from the structure of the field generation portion 602 via one or more capacitors 615 or any other device having an impedance with a reactive component. The capacitor 615 can be variable in order to add a further parameter of control over the ionizing electric field, and can be controlled by control circuitry or logic such as control circuitry or logic 150 as discussed with reference to FIG. 1. The location of the capacitor 615 is merely illustrative, and not meant to limit where the capacitor 615 can be coupled to the field generation portion 602.

In one variation, the biased conductive tube 616 can be DC biased (possibly in combination with an AC bias) so as to controllably attenuate the ionizing electric field. By altering the DC bias, the level of attenuation, and thus the field strength in the receiving portion 606, can be controlled.

Figure 6C:
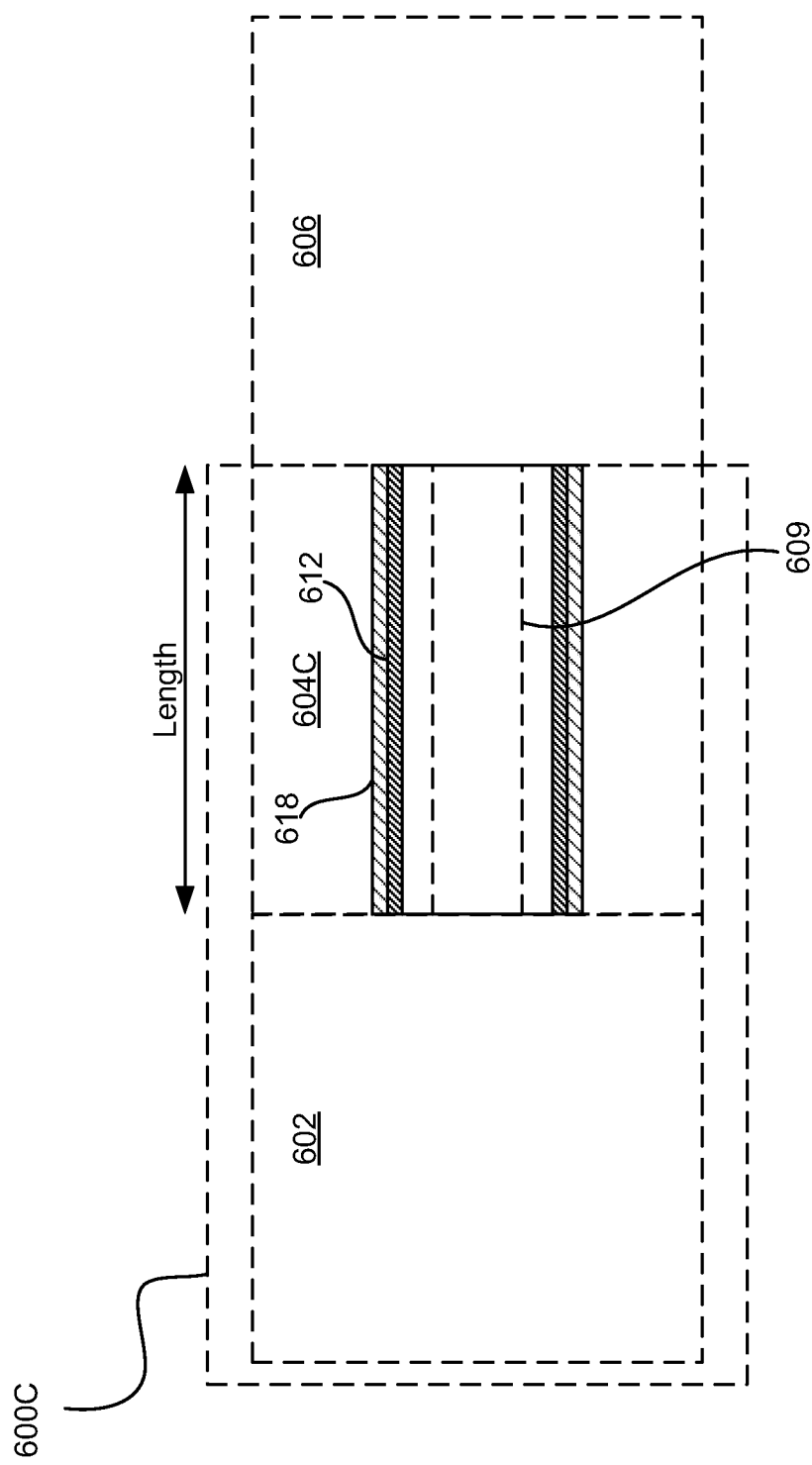
FIG. 6c illustrates yet another embodiment of a field projection portion.

FIG. 6c illustrates yet another embodiment of a field projection portion 604C. The projected plasma source 600C has a field projection portion 604C comprising a floating conductive tube 618 with a dielectric layer 612 between the third portion of the plasma 609 and the floating conductive tube 618.

The plasma 609 shape in FIGS. 6a, 6b, and 6c is merely illustrative and should not be interpreted as limiting.

Figure 7A:
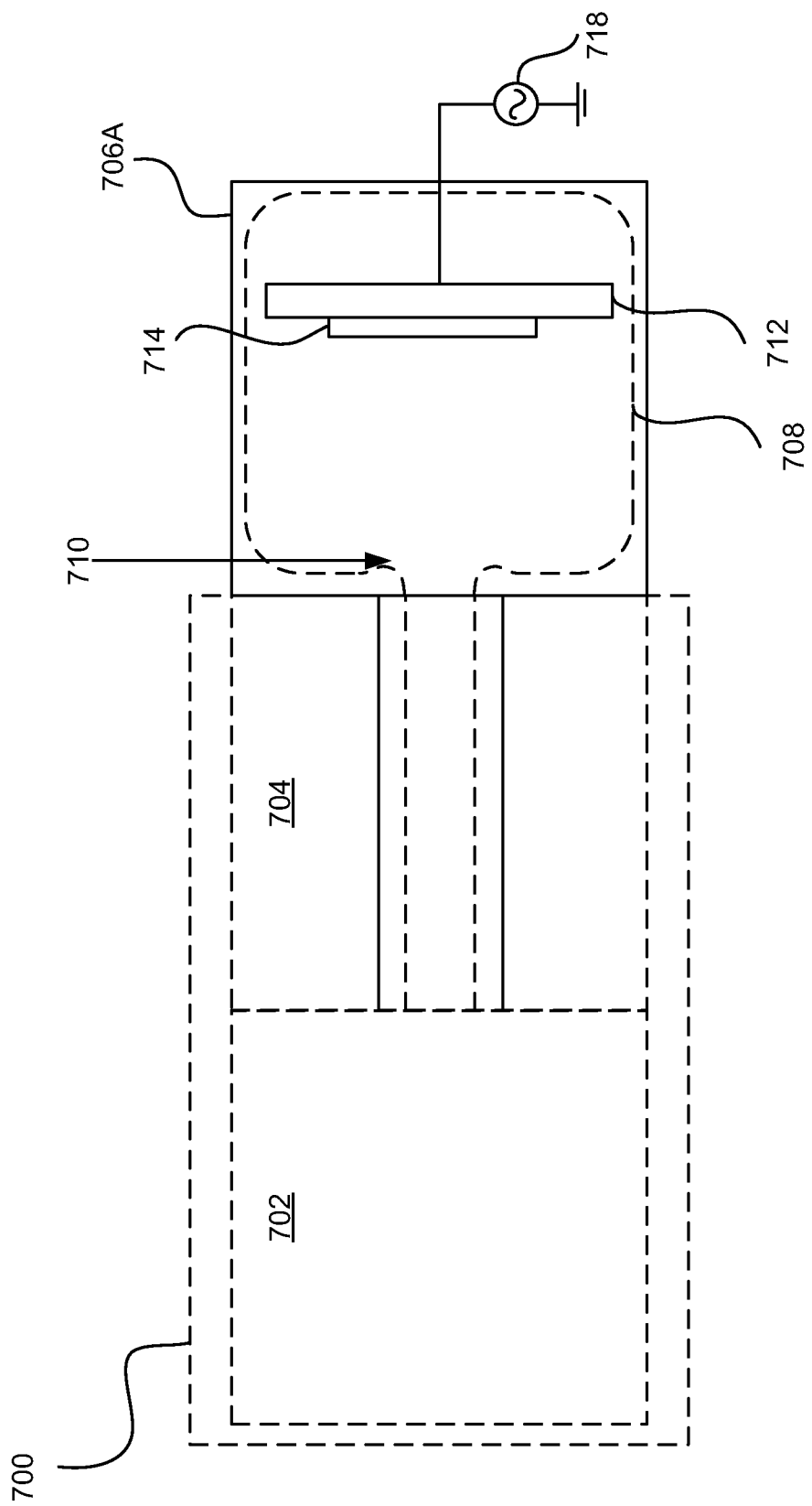
FIG. 7a illustrates an embodiment of a receiving portion coupled to an exemplary projected plasma source.

FIG. 7a illustrates an embodiment of a receiving portion 706A coupled to an exemplary projected plasma source 700. The projected plasma source 700 is coupled to a receiving portion 706A with a second portion of a plasma 708 being sustained in the receiving portion 706A. The ionizing electric field enters the receiving portion 706A with enough strength and voltage to ionize some particles and sustain the second portion of the plasma 708. Since the second portion of the plasma 708 may be entering the receiving portion 706A, an energy to sustain the second portion of the plasma 708 may be lower than it would be were there no plasma 708 to assist the ionization process. The second portion of the plasma 708 can be used for any of a variety of semiconductor and thin-film processing and chamber cleaning operations. For instance, etching a substrate 714 fixed to a substrate holder 712 and biased via power source 718, or generating radicals for cleaning surfaces inside the receiving portion 706A after a deposition process, or assisting in deposition of a thin film on the substrate 714, to name just three non-limiting examples.

The power source 718, whether AC, DC, pulsed DC or any other time-varying power, can be controlled via control circuitry or logic such as the control circuitry or logic 150 discussed with reference to FIG. 1. Sensors in the receiving portion 706A can communicate with the control circuitry or logic so that the power source 718 can be feedback or feedforward controlled.

Substrates can include semiconductor wafers, glass sheets, and polymer sheets, to name just a few non-limiting examples. The substrate 714 can be biased through the conductive substrate holder 712 via an AC, pulsed DC, or other time-varying bias 718 as illustrated, or can be DC biased or grounded. In an embodiment, the substrate 714 can be biased with both an AC and DC bias.

Figure 7B:
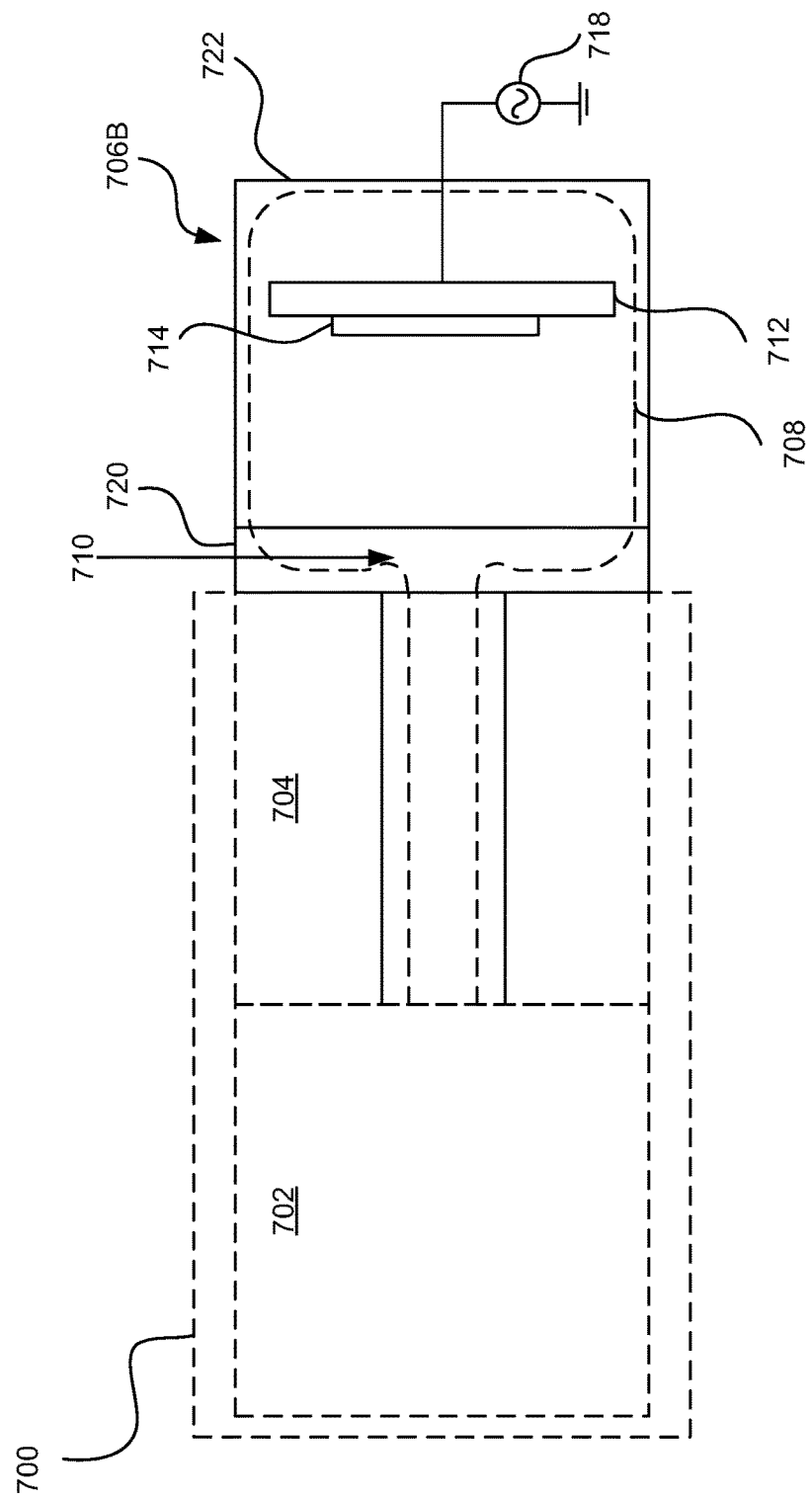
FIG. 7b illustrates another embodiment of a receiving portion coupled to an exemplary plasma source.

In an embodiment, the receiving portion 706A includes a plasma processing chamber. The plasma processing chamber can be constructed to handle and contain low frequency plasma. In an embodiment, the receiving portion 706A includes an optional gas-plasma interaction chamber 720 coupled to a plasma processing chamber 722. Non-activated gas 710 and the second portion of the plasma 708 can interact to form radicals in the gas-plasma interaction chamber 720 (see FIG. 7b). In FIG. 7b, the receiving portion 706B includes a plasma processing chamber 722 and a gas-plasma interaction chamber 720.

Referring again to FIG. 7a, in some plasma processing applications (e.g., metal etching) it can be desirable to use a plasma with a negligible voltage relative to a primary ion bias (e.g., power supply 718). Typically, in-situ-generated plasma has an inherent voltage that adds to the primary ion bias, and even where the primary ion bias is set to zero, the sum of the plasma bias and the primary ion bias can be greater than desired. Thus, in-situ generated plasma can set a lower limit on ion energy.

By providing an attenuated ionizing electric field to the receiving portion 706A, the plasma bias can be significantly reduced or eliminated, for instance, to a point at which the plasma bias can be neglected relative to the primary ion bias. The receiving portion 706A can include a substrate 714 biased via power source 718 through the substrate holder 712 with a bias that is dominated by the power source 718 rather than energy in the second portion of the plasma 708. In other words, the second portion of the plasma 708 energy bias effect on ions in the receiving portion 706A or on the substrate bias 714 can be negligible relative to the bias of the power source 718. In an embodiment, the effective minimum voltage bias (or the minimum ion energy distribution) applied to the substrate 714 is less than that associated with in-situ plasma generation. The second portion of the plasma 708 can be associated with ion energies in the receiving portion 706A of around 1 V or less. For instance, ion energies of the second portion of the plasma 708 can be 0.001 to 0.1 of the voltage of an in-situ-generated plasma.

The second portion of the plasma 708 having low ion energy has a variety of semiconductor and thin-film processing applications. For instance, the second portion of the plasma 708 can be used in etching (e.g., plasma-assisted chemical etching) where experimental results demonstrate that silicon etch rates of at least 34 microns per minute are possible using the systems, methods, and apparatuses herein disclosed. This high etch rate has particular application to through-wafer vias, silicon thinning, and other silicon etching. If scaled, this high etch rate may be applicable to large area uniform etching of multiple wafers within a single processing chamber, for instance via an array of projected plasma sources. The second portion of the plasma 708 can also be used in sputtering, ion implantation, deposition (e.g., plasma assisted chemical vapor deposition, ALD, and MOCVD, to name a few), photoresist strip, polymer etching, low-K ashing, and in-situ cleaning.

The plasma can be directed and distributed throughout the receiving portion 706A via a variety of means including physical deflectors (e.g., baffles, angled deflectors, showerheads) or electromagnetic plasma directing means (e.g., an electric field that changes a plasma direction as it enters the receiving portion 706A).

In an embodiment, non-activated gas 710 can be directed to contact the second portion of the plasma 708 after the plasma 708 enters the receiving portion 706A. As the non-activated gas 710 contacts the second portion of the plasma 708, the second portion of the plasma 708 excites particles in the non-activated gas 710 and energizes at least a portion of the gas 710 to form radicals that can be used for various semiconductor and thin-film processing applications. Advantageously, this embodiment allows radicals to be formed without the disadvantages of remote sources or traditional in-situ sources. Specifically, since the radicals are formed inside the plasma receiving portion 706A, they do not have to travel from a remote source and potentially interact with system components and gas molecules en route to a processing chamber. Also, since the high energy used to form the ionizing electric field is remote from the receiving portion 706A and the ionizing electric field has just enough energy to sustain the second portion of the plasma 708, the receiving portion 706A will not be damaged by high energy power in the plasma, etched by high energy ions, nor release high frequency power, for instance via a glass viewing window of the processing chamber. Thus, several embodiments combine the advantages of remote sources and in-situ sources while avoiding their disadvantages.

In another embodiment, two or more different streams of radicals can be formed at different locations in the projected plasma source 700. For instance, a first non-activated gas (e.g., $NF_3$ or $N_2$, to name two) can pass through the plasma in the field generation portion 702 and be at least partially ionized to form first radicals. The first radicals and the ionizing electric field can pass through the field projection portion 704 and into the receiving portion 706A. A second non-activated gas (e.g., silane) 710 can interact with the second portion of the plasma 708 at or near an entrance to the receiving portion 706A and be at least partially ionized by the second portion of the plasma 708 to form second radicals. Both the first and second radicals can then be used in the receiving portion 706A for various semiconductor and thin-film processes (e.g., chamber cleaning). In an embodiment, the non-activated gas 710 such as silane can be dispersed into the receiving portion 706A via a ring-shaped dispersing mechanism (not illustrated) so that the non-activated gas 710 is distributed in a ring pattern.

Figure 8:
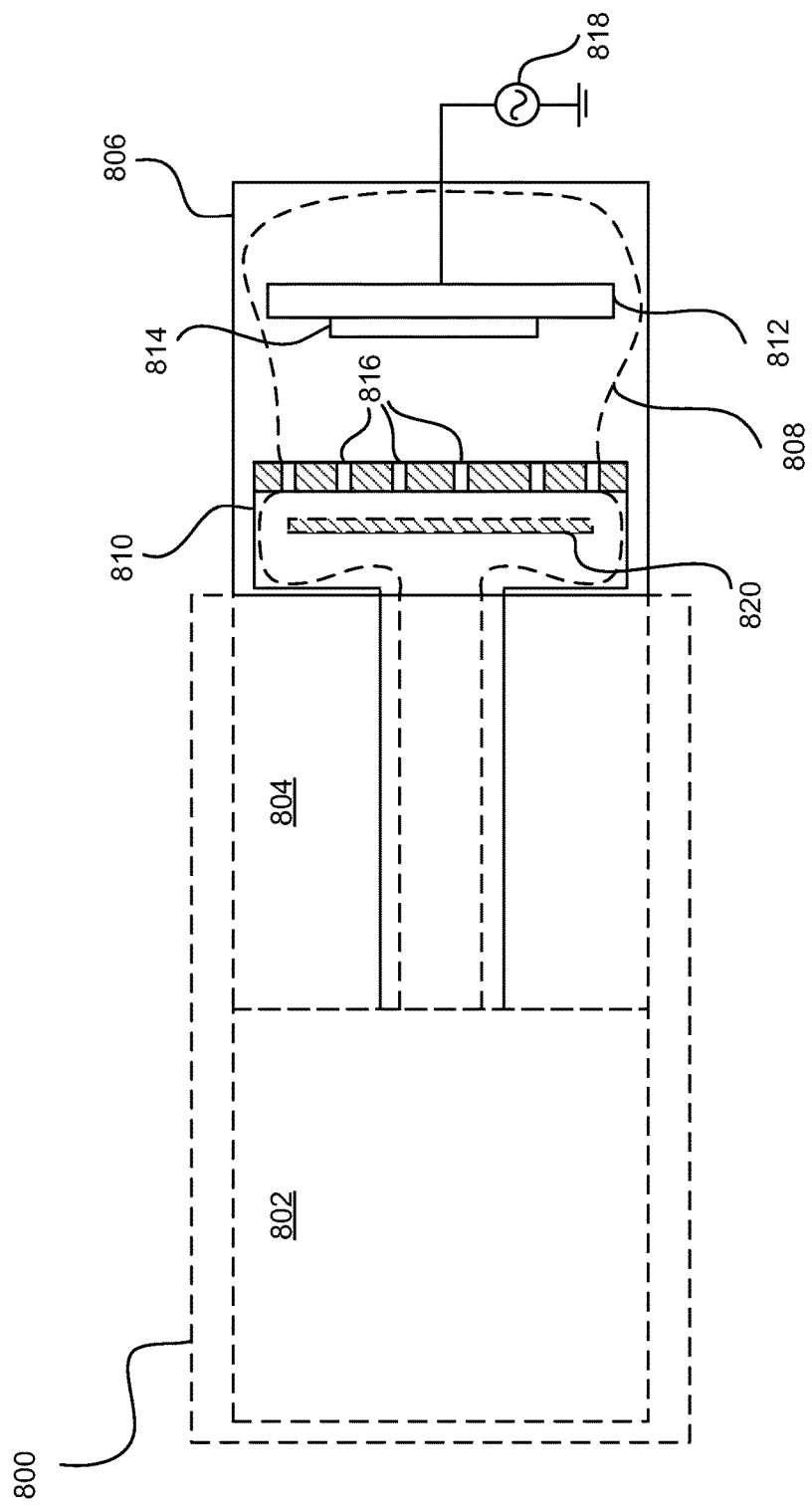
FIG. 8 illustrates yet another embodiment of a receiving portion.

FIG. 8 illustrates yet another embodiment of a receiving portion 806. The receiving portion 806 is coupled to a projected plasma source 800 and includes a gas displacer 820 and a showerhead 810 for dispersing and directing gas flow to a substrate 814 coupled to a biased substrate holder 812. For plasma-assisted deposition, a gas can feed into the showerhead 810 and pass through a plurality of apertures 816 in order to direct and disperse the gas in the receiving portion 806. Optionally, a displacer 820 can further disperse the gas within the showerhead 810. The gas can then be used to deposit thin films on the substrate 814, which is biased through the substrate holder 812 by a power source 818.

Thin film tends to deposit throughout the processing chamber rather than just on the substrate 814. These surfaces can be cleaned (after removing the substrate 814) via exposing them to radicals formed when a non-activated gas is passed through a plasma. One way to do this is via radical formation in a remote source. However, some of the radicals, in particular charged particles and energetic atomic species, neutralize before they reach the receiving portion 806 and are thus not typically part of the cleaning process (e.g., ions become non-ionized and energized particles lose some of their energy). Yet, these charged particles or energetic atomic species are desirable since they can enhance cleaning.

A projected plasma increases the number of energetic particles that can be used in cleaning the receiving portion 806 by generating some radicals within the receiving portion 806 itself. While many radicals are still formed by passing a non-activated gas through a first portion of a plasma in the generation portion 802, a second portion of the plasma 808 is sustained within the receiving portion 806 such that radicals continue to be formed even within the receiving portion 806. Since these radicals are far closer to the surfaces to be cleaned, more energetic particles are available to take part in cleaning than when a remote non-projected source is used. Hence, the projected plasma source 800 produces a far more effective mix of radicals for cleaning the receiving portion 806 than known remote sources.

While the power source 818 is illustrated as an AC (e.g., RF) source, in some variations the power source 818 can be a DC or pulsed DC power source. The power source 818 can be a voltage or current source, for example. In some variations, the substrate holder 812 and the substrate 808 are not biased (e.g., the substrate holder 812 can be grounded or floating).

Traditional showerheads 810 may not stand up to the heat and reactivity of plasma and thus may have to be reengineered in order to withstand interaction with the second portion of the plasma 808. However, in some embodiments, the projected plasma source as disclosed herein can be used in combination with typical and unaltered receiving portions 806. Avoiding the showerhead 810 of FIG. 8 may be preferable where a greater density of the second portion of the plasma 808 is desired for direct interaction with the substrate 814 (e.g., etching). For such applications, the showerhead 810 can reduce the plasma density since the second portion of the plasma 808 can be extinguished when passing through the apertures 816 (e.g., via contact with 'cool' surfaces of the apertures 816 and higher pressure as the second portion of the plasma 808 passes through the apertures 816).

Figure 9:
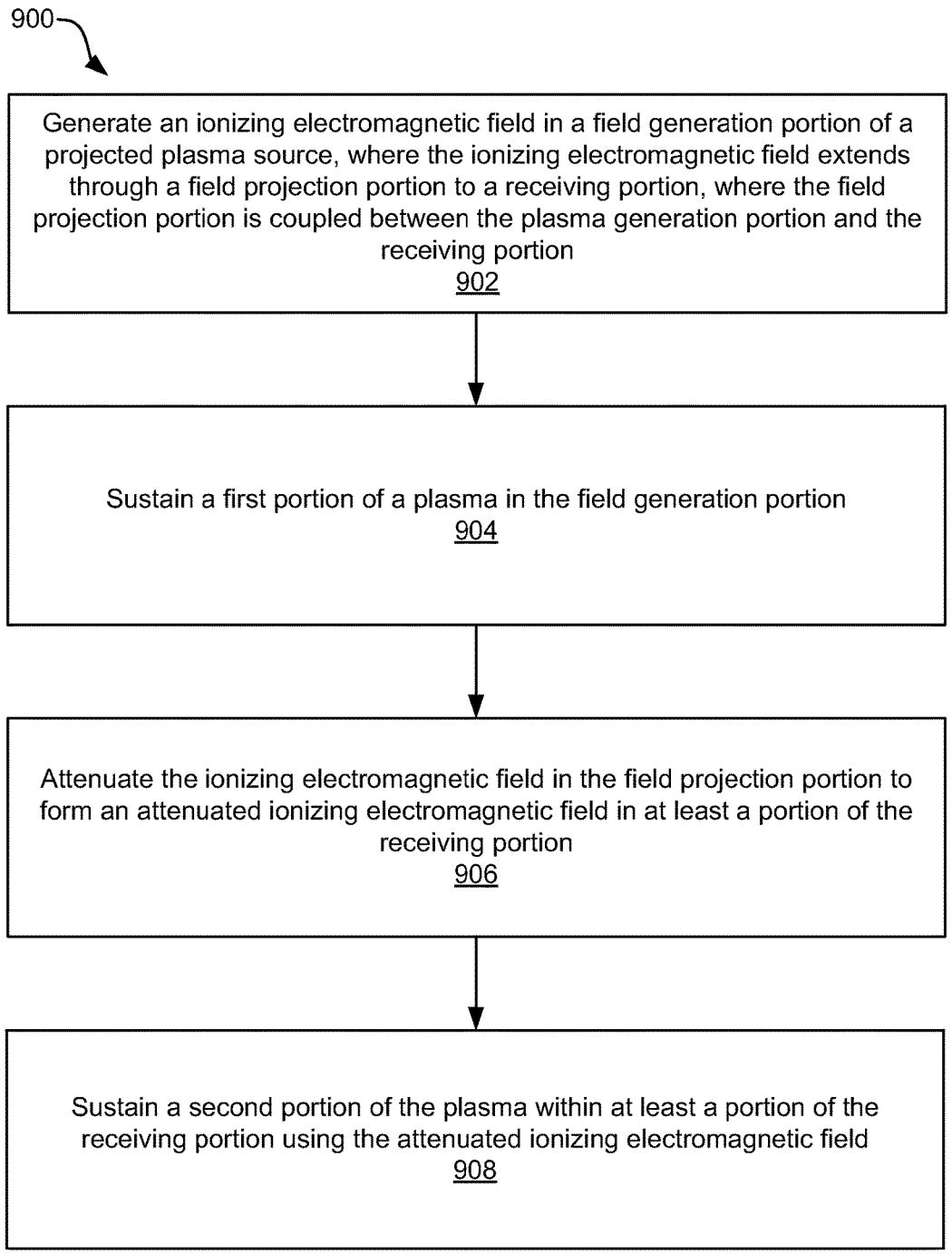
FIG. 9 illustrates an embodiment of a method that may be traversed in connection with embodiments described with reference to FIGS. 1-8.

FIG. 9 illustrates an embodiment of a method 900 that may be traversed in connection with embodiments described with reference to FIGS. 1-8. The method 900 generates a first portion of a plasma via an ionizing electric field in a field generation portion, projects the ionizing electromagnetic field through a field projection portion to a plasma receiving portion, and uses an attenuated ionizing electric field to sustain a second portion of the plasma inside the receiving portion. The method 900 can be carried out using any of the embodiments of a projected plasma source as discussed earlier with reference to FIGS. 1-8. The method 900 includes generating an ionizing electromagnetic field in a field generation portion of a projected plasma source in a generate operation 902, sustaining a first portion of a plasma in the field generation portion in a first sustain operation 904, attenuating the ionizing electromagnetic field in the field projection portion to form an attenuated ionizing electromagnetic field in at least a portion of the receiving portion in an attenuate operation 906, and sustaining a second portion of the plasma within at least a portion of the receiving portion using the attenuated ionizing electromagnetic field in a second sustain operation 908.

The generate operation 902 generates an ionizing electromagnetic field (e.g., an electric or magnetic field) that extends through a field projection portion to a receiving portion. The field projection portion can be coupled between the field generation portion and the field receiving portion. The ionizing electromagnetic field can be electric, magnetic, or a combination of the two, and can capacitively (e.g., FIGS. 2-4) or inductively (e.g., FIG. 5) couple into the plasma. Once coupled into the plasma, the field can pass through the plasma with little losses or attenuation due to the plasma's conductivity. Since the method 900 sustains a plasma that extends through the field projection portion and into the receiving portion, the ionizing electromagnetic field can traverse this plasma and enter the receiving portion with little attenuation.

The first sustain operation 904 sustains a first portion of the plasma within and proximal to the field generation portion. The second portion of the plasma exists within the receiving portion and has less energy than the first portion of the plasma, but enough energy to sustain the second portion of the plasma.

However, the field projection portion can be configured to controllably attenuate the ionizing electromagnetic field, via attenuate operation 906, as it traverses the plasma en route to the receiving portion. The field projection portion can have a length and/or cross sectional dimensions (e.g., length and width or diameter) configured to attenuate the ionizing electromagnetic field such that the ionizing electromagnetic field is an attenuated ionizing electromagnetic field by the time the ionizing electromagnetic field reaches the receiving portion. The field projection portion can also include a dielectric coating or layer on an inner surface of the field projection portion that also or alternatively attenuates the ionizing electromagnetic field. The ionizing electromagnetic field strength can also be modified during operation, for instance with a variable DC or AC bias on the field projection portion. The attenuate operation 906 results in an attenuated ionizing electromagnetic field—one that has less energy than the ionizing electromagnetic field in the field generation portion, but has enough energy to sustain the second portion of the plasma in the receiving portion. In other words, the attenuate operation 906 can attenuate the field such that the energy in the second portion of the plasma is no more than necessary to maintain ionization within the receiving portion (e.g., where the rate of ionization exceeds the rate of charged particle recombination or neutralization).

As noted above, a second portion of the plasma can be sustained within at least a portion of the receiving portion via the attenuated ionizing electromagnetic field in the second sustain operation 908. The plasma can be sustained within any part of the receiving portion including the entire receiving portion. For instance, where a showerhead is used, or where the field strength decays rapidly within the receiving portion, the plasma may only be sustained in a portion of the receiving portion. In contrast, where no showerhead is used and/or where the field strength remains relatively constant throughout the receiving portion, the plasma may be sustained in a greater portion of the receiving portion if not the whole receiving portion.

Additionally, a non-activated gas can be passed into the plasma (e.g., either at the first or second portion of the plasma). In an embodiment, a first non-activated gas can be passed into the first portion of the plasma and a second non-activated gas can be passed into the second portion of the plasma.

In conclusion, the present disclosure provides, among other things, a method, system, and apparatus that remotely generates and sustains a first portion of a plasma and extends the field used to generate the plasma to a receiving portion where a second portion of the plasma can be sustained using the field once it has been attenuated. Those skilled in the art can readily recognize that numerous variations and substitutions may be made in the disclosure, its use, and its configuration to achieve substantially the same results as achieved by the embodiments described herein. Accordingly, there is no intention to limit the disclosure to the disclosed exemplary forms. Many variations, modifications, and alternative constructions fall within the scope and spirit of the disclosure.

What is claimed is:

1. A plasma source comprising:
   a field generation portion including:
      a central electrode;
      a perimeter electrode that at least partially surrounds the central electrode, the central and perimeter electrodes electrostatically generate a plasma by coupling energy into the plasma, and the central and perimeter electrodes generating an ionizing electromagnetic field that extends out of the field generation portion; and
      a power input configured to receive a current to be passed between the central and perimeter electrode;
   a field projection portion coupled to the field generation portion, wherein the field projection portion comprises a conductive tube having a dielectric inner layer, wherein the field projection portion attenuates the ionizing electromagnetic field to form an attenuated ionizing electromagnetic field configured to have sufficient energy to sustain a plasma within a plasma chamber configured for coupling to the field projection portion, wherein the field projection portion is configured to be at least partially external to the plasma chamber; and
   a bias coupled to the field projection portion that capacitively applies one of the following to the field projection portion to attenuate the ionizing electromagnetic field: a controllable DC bias, and a combination of a controllable AC and a controllable DC bias;
   wherein the field projection portion has a longitudinal axis that is longer than a widest inner diameter of the field projection portion, and where the field projection portion includes a dielectric that is parallel to the longitudinal axis of the field projection portion and thereby attenuates portions of the ionizing electromagnetic field that are transverse to a longitudinal axis of the field projection portion,
   wherein electrodes of the field generation portion extend no further toward the plasma chamber than an end of the field generation portion.

2. The plasma source of claim 1, wherein the field projection portion controllably attenuates the ionizing electromagnetic field.

3. The apparatus of claim 1, wherein an interface between the field generation portion and the field projection portion is devoid of constrictions.

4. The apparatus of claim 1, wherein an interface between the field projection portion and the plasma chamber is devoid of constrictions.

5. The apparatus of claim 1, wherein the field projection portion includes a cylindrical dielectric wherein a thickness of the dielectric is less than an inner radius of the field projection portion, where the inner radius extends from a longitudinal axis of the field projection portion to an inner surface of the dielectric.

6. The apparatus of claim 1, wherein the field generation portion includes a dielectric between electrodes of the field generation portion and an inside of the field generation portion.

7. The apparatus of claim 1, wherein the bias is configured to be adjusted during operation of the plasma source.

8. The apparatus of claim 1, wherein the controllable AC bias is phase shifted relative to an AC applied in the field generation portion.

9. The apparatus of claim 1, further comprising one or more sensors within the plasma chamber that are coupled to the controllable AC bias and provide feedback for controlling the controllable AC bias and thereby for controlling attenuation of the ionizing electromagnetic field.

10. The apparatus of claim 9, wherein the field projection portion is electrically isolated from the field generation portion via one or more devices having an impedance with a reactive component.

11. The apparatus of claim 10, wherein the one or more devices have a variable impedance and a variable reactance and are controlled by control circuitry.

12. A plasma source comprising:
    a field generation portion including:
       a central electrode;
       a perimeter electrode that at least partially surrounds the central electrode, the central and perimeter electrodes electrostatically generate a plasma by coupling energy into the plasma, and the central and perimeter electrodes generating an ionizing electromagnetic field that extends out of the field generation portion; and
       a power input configured to receive a current to be passed between the central and perimeter electrode;
    a field projection portion coupled to the field generation portion, wherein the field projection portion comprises a conductive tube having a dielectric inner layer, wherein the field projection portion attenuates the ionizing electromagnetic field to form an attenuated ionizing electromagnetic field, having a lower voltage than the ionizing electromagnetic field in the field generation portion, yet a voltage high enough to sustain a plasma within a plasma chamber configured for coupling to the field projection portion, wherein the field projection portion is configured to be at least partially external to the plasma chamber; and
    a bias coupled to the field projection portion that applies one of the following to the field projection portion to attenuate the ionizing electromagnetic field, a level of the bias being such as to achieve a plasma voltage within the plasma chamber that is lower than the plasma voltage in the field generation portion and to achieve an ion energy in the plasma chamber that is independent from the current at the power input of the field generation portion:
       a controllable AC bias;
       a controllable DC bias; and
       a combination of a controllable AC and a controllable DC bias;

wherein the bias coupled to the field projection portion is phase shifted from, and electrically isolated from, the central and perimeter electrodes of the field generation portion;

wherein the field projection portion has a longitudinal axis that is longer than a widest inner diameter of the field projection portion, and where the field projection portion includes a dielectric that is parallel to the longitudinal axis of the field projection portion.

13. The plasma source of claim 12, wherein the bias coupled to the field projection portion is electrically isolated from the central and perimeter electrodes of the field generation portion by one or more reactive components.

14. The plasma source of claim 13, wherein the one or more reactive components have a variable impedance and a variable reactance.

15. The plasma source of claim 12, wherein the level of the bias is selected to achieve a 0.5 V-10 V plasma voltage within the plasma chamber.

16. The plasma source of claim 12, wherein the level of the bias is selected to achieve a plasma voltage within the plasma chamber less than 1.0 V.

17. The plasma source of claim 12, wherein the power input is configured to receive very high frequency current, while the plasma chamber is configured to receive low frequency current.

18. The plasma source of claim 17, wherein the very high frequency is between 5 and 300 MHz.

19. The plasma source of claim 18, wherein the very high frequency is between 30 and 150 MHz.

20. The plasma source of claim 18, wherein the low frequency is below 5 MHz.

21. The plasma source of claim 12, further comprising a power source coupled to a substrate through a substrate holder, wherein a bias on the substrate is dominated by the power source rather than a bias from the plasma.

* * * * *